(12) United States Patent
Sadwick et al.

(10) Patent No.: US 7,709,292 B2
(45) Date of Patent: May 4, 2010

(54) PROCESSES AND PACKAGING FOR HIGH VOLTAGE INTEGRATED CIRCUITS, ELECTRONIC DEVICES, AND CIRCUITS

(76) Inventors: Laurence P. Sadwick, 3767 E. Brockbank Dr., Salt Lake City, UT (US) 84124; Mohammad M. Mojarradi, 163 Starlight Crest Dr., La Canada, CA (US) 91011; Ruey-Jen Hwu, 3767 E. Brockbank Dr., Salt Lake City, UT (US) 84124; Jehn-Huar Chern, 1597 S. Foothill Dr., Apt. 60, Salt Lake City, UT (US) 84108

( * ) Notice: Subject to any disclaimer, the term of this patent is extended or adjusted under 35 U.S.C. 154(b) by 209 days.

(21) Appl. No.: 11/541,429

(22) Filed: Sep. 29, 2006

(65) Prior Publication Data

US 2008/0081423 A1  Apr. 3, 2008

(51) Int. Cl.
 *H01L 21/02* (2006.01)
(52) U.S. Cl. .............. 438/107; 438/110; 438/113; 438/121; 257/723; 257/724; 257/725; 257/E21.532
(58) Field of Classification Search .......... 257/620, 257/723–725; 438/128, 107, 110, 111, 112, 438/113, 400
See application file for complete search history.

(56) References Cited

U.S. PATENT DOCUMENTS

| | | | |
|---|---|---|---|
| 4,908,328 A | | 3/1990 | Hu et al. |
| 5,250,460 A | * | 10/1993 | Yamagata et al. ........... 438/458 |
| 5,382,826 A | | 1/1995 | Mojaradi et al. |
| 5,448,114 A | | 9/1995 | Kondoh et al. |
| 5,577,617 A | | 11/1996 | Mojarradi et al. |
| 5,699,231 A | | 12/1997 | ElHatem et al. |
| 5,739,582 A | | 4/1998 | ElHatem et al. |
| 6,537,850 B1 | * | 3/2003 | Corisis ....................... 438/106 |
| 6,673,680 B2 | | 1/2004 | Calafut |
| 2004/0113283 A1 | * | 6/2004 | Farnworth et al. ........... 257/782 |
| 2005/0101059 A1 | * | 5/2005 | Yang ........................... 438/127 |
| 2005/0269700 A1 | | 12/2005 | Farnworth et al. |
| 2006/0189099 A1 | | 8/2006 | Lu et al. |

FOREIGN PATENT DOCUMENTS

WO  WO 88/04106  6/1988

OTHER PUBLICATIONS

"NANO™ PMMA and Copolymer" and "NANO™ SU-8" brochures. Micro Chem, 1254 Chestnut Street, Newton, MA 02464. www.microchem.com.

(Continued)

*Primary Examiner*—Marcos D. Pizarro
*Assistant Examiner*—Eva Y Montalvo

(57) ABSTRACT

The present invention includes processes and packaging for high voltage integrated circuits (ICs), high voltage electronic devices and high voltage electronic circuits which operate over a wide range of voltages, e.g., from tens of volts to tens of thousands of volts. The inventive processes and packaging are particularly suitable for integrating low or lower voltage circuits or transistors to form high voltage ICs, high voltage electronic devices and high voltage electronic circuits. The inventive processes and packaging are also particularly suitable for isolating high voltage electronics to achieve high breakdown voltages and for supporting high voltage operation. The inventive processes may be used with any suitable semiconductor materials using conventional semiconductor fabrication and related facilities.

19 Claims, 15 Drawing Sheets

OTHER PUBLICATIONS http://www.scscookson.com/parylene/properties.cfm "Parylene Conformal Coating Specifications & Properties".

http://www.williams-adv.com/packagingMaterials/combo-lids.php Williams Advanced Materials Combo Lids.

http://photonics.com/directory/dictionary/lookup.asp?url=lookup&entrynum=2785&letter=k Photonics Dictionary Definition of "Kovar".

\* cited by examiner

...

PROCESSES AND PACKAGING FOR HIGH VOLTAGE INTEGRATED CIRCUITS, ELECTRONIC DEVICES, AND CIRCUITS

BACKGROUND OF THE INVENTION

1. Field of the Invention

The present invention relates generally to processes and packaging for high voltage integrated circuits (ICs), electronic devices and high voltage electronic circuits. More particularly, this invention relates to processes for fabrication and manufacturing of high voltage integrated electronics that are capable of voltage operation in a range of tens of volts to tens of thousands of volts.

2. Description of Related Art

High voltage integrated circuits (ICs), electronic devices and circuits find many applications. High voltage ICs, high voltage electronic devices and circuits may be used to replace bulky discrete electronic components such as individual high voltage transistors, resistors and transformers. Additionally, it is desirable to integrate these generally bulky discrete high voltage components directly on silicon, in a package, or on a printed circuit board (PCB) to achieve greater miniaturization, higher reliability and lower power consumption. Such high voltage ICs, electronic devices and circuits may also reduce the size and cost of current high voltage electronics that employ bulky electronics components by eliminating at least some "pick and place" operations required of a large number of electronic components. Furthermore, there is also the opportunity to use mass production facilities and processes that are commonly used for fabricating integrated circuits.

However, high voltage electronics require careful attention to physical layouts when formed on semiconductor substrates and when mounting on PCBs. This is because the high voltages may cause arcing to nearby components, or circuit traces and thereby cause malfunction and/or damage to the circuits. Breakdown voltage, $V_{bd}$, is a common measure of an electronic component's ability to tolerate high voltages. Electronic devices having a high breakdown voltage, $V_{bd}$, are more tolerant to device failure. Thus, it is desirable to have a high breakdown voltage, $V_{bd}$, in high voltage ICs, high voltage electronic devices and circuits.

Early approaches to integrating high voltage components were focused at the PCB level. For example, U.S. Pat. No. 5,699,231 to ElHatem et al. discloses isolating discrete electrical components on a PCB having slots or other cut out shapes to prevent charge migration on the surface of the board between high and low voltage nodes in combination with potting of the surface of the PCB. The slots or other cut out shapes allow the potting material to flow around and through the board and the electronic devices. However, the ElHatem et al. approach only achieves greater densities at the PCB level.

Other approaches have been taken to manufacture high voltage ICs. For example, U.S. Pat. No. 5,382,826 to Mojaradi et al. discloses the integration of a high voltage transistor by stacking any number of lower voltage transistors. As disclosed in the Mojarradi et al. patent, spiral and star shaped field plates may be used to space out the equipotential field lines to avoid voltage concentrations. Mojarradi et al. further discloses that the voltage range for the circuit may be increased by stacking several devices in series configuration. However, such series stacking configurations generally require high voltage resistors for correctly biasing gate voltages through a voltage divider network and other means. Even in integrated form, high voltage resistors are bulky. Thus, it would be particularly advantageous to have a process that also readily provides high voltage resistors for use in biasing high voltage transistors and other applications.

U.S. Pat. No. 4,908,328 to Hu et al. discloses a process for forming an oxide isolated semiconductor wafer which can include the formation of an associated high voltage transistor. The Hu et al. process includes bonding a first wafer to a second wafer using oxide, forming a groove through the oxide and back-filling with an epitaxially regrown semiconductor for placement of the high voltage devices. However, Hu et al. does not appear to disclose the formation of individual circuits on a substrate, separating the individual circuits on the substrate, dicing a module from the separated individual circuits, isolating the module, making connections on the module and back-filling to further isolate the individual circuits and to achieve high breakdown voltage, $V_{bd}$.

Another approach to packaging high voltage transistors is disclosed in U.S. Pat. No. 5,577,617 to Mojarradi et al. More particularly, the '617 patent discloses the use of a lead frame for mounting multiple individual transistors while isolating substrates to achieve electrically stackable high voltage transistors in a single package. The '617 patent also discloses that further isolation may be achieved by using an isolating epoxy to encapsulate the die mounted on the die mount tabs. The encapsulation provides further insulation because the dielectric constant of the encapsulant is greater than that of air.

U.S. Pat. No. 5,739,582 to ElHatem et al. discloses a method of packaging multiple high voltage devices in a multi-chip module. More particularly, the '582 patent discloses the mounting of any number of high voltage chips in a cavity of a package, electrically connecting the high voltage devices together and to a lead frame. The '582 patent further discloses the use of three coatings to provide further isolation. First, a non-conductive epoxy for mounting the devices to the cavity floor is applied. Second, a thin layer of polyimide or Dupont™ Pyralux™ is applied to the downward side of each of the devices. Finally, a die coating of Q1-6646 Hipec™ Gel die coat material is applied to the upward side of each chip to suppress arcing. However, the '582 patent warns that "it is essential to use all three coating materials, the polyimide 68, the die coating 70, and the non-conductive epoxy 72 to achieve and sustain the high operating voltages. If even one of the coating materials is missing or defective the voltage sustainable by the packaging drops dramatically and reliability of the parts will be severely downgraded." Col. 4, ll. 6-11.

Accordingly, there still exists a need in the art for processes and packaging for integrating lower voltage electronic devices to form high voltage integrated circuits, high voltage electronic devices and circuits.

SUMMARY OF THE INVENTION

An embodiment of a process for integrating electronics is disclosed. The process may include providing a semiconductor having electronics. The process may further include providing an insulator and bonding the semiconductor to the insulator or coating the semiconductor with the insulator. The process may further include trenching the electronics to physically separate them from each other on the semiconductor. The process may further include dicing the trenched electronics to form at least one insulated module. The process may further include attaching the at least one insulated module to a chip carrier and electrically connecting the at least one insulated module to the chip carrier to obtain an integrated circuit.

Another embodiment of a process for integrating electronics is disclosed. The process may include providing a semiconductor substrate further comprising electronics. The process may further include applying a polyimide layer or other insulating layer to the semiconductor substrate. The process may further include trenching the electronics to form trenched electronics and dicing the trenched electronics to form at least one insulated module. The process may further include attaching the at least one insulated module to a chip carrier and electrically connecting the at least one insulated module to the chip carrier to obtain an integrated circuit.

An embodiment of a method of packaging integrated circuits is also disclosed. The method may include providing a processed semiconductor wafer with electronics fabricated thereon. The method may further include optionally grinding the processed semiconductor wafer to reduce thickness. The method may include dicing the processed semiconductor wafer to physically separate the electronics into dice. The method may include bonding the dice to an electronics package. The method may include electrically connecting the dice to each other and to the electronics package. The method may include back-filling gaps between and around the dice and sealing the electronics package to provide a packaged integrated circuit.

An embodiment of a method of flip-chip packaging integrated circuits according to the present invention is disclosed. The method may include providing a processed semiconductor wafer having electronics fabricated on an electronics side and bulk semiconductor on a substrate side. The method may further include optionally grinding the substrate side to reduce thickness. The method may further include bonding a stacked wafer to the substrate side and applying under-bump metallization to the electronics side. The method may further include dicing the processed semiconductor wafer to physically separate the electronics into dice and separating at least one of the dice as an electronics module. The method may further include flip-chip bonding the electronics module to a flip-chip carrier. The method may further include coating the electronics module with an insulator and optionally underfilling gaps between the electronics module and the flip-chip carrier.

BRIEF DESCRIPTION OF THE SEVERAL VIEWS OF THE DRAWINGS

The following drawings illustrate exemplary embodiments for carrying out the invention. Like reference numerals refer to like parts in different views or embodiments of the present invention in the drawings.

DETAILED DESCRIPTION OF THE INVENTION

Reference will now be made to figures of embodiments of the present invention, wherein like structures will be provided with like reference designations. It is understood that the drawings are diagrammatic and schematic representations of exemplary embodiments of the present invention and are neither limiting of the present invention nor are they necessarily drawn or shown to scale.

FIGS. 1A-1E are illustrations of an embodiment of a process for packaging integrated circuits using insulators according to the present invention. The process disclosed below allows high breakdown voltages, e.g., thousands of volts, to be achieved from individual transistors. Integrated circuits formed according to the process illustrated in FIGS. 1A-1E are particularly suitable for high voltage electronics with high breakdown voltage, $V_{bd}$.

Figure 1A:
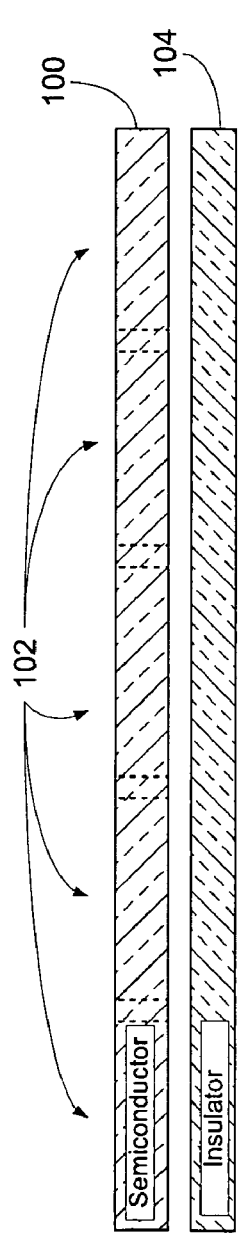
FIGS. 1A-1E are illustrations of an embodiment of a process for integrating electronics using an insulator according to the present invention.

Referring to FIG. 1A, a semiconductor 100 may be provided with electronics, shown generally at 102. The semiconductor 100 may be formed of silicon, germanium, gallium arsenide, gallium nitride, silicon carbide, diamond, other group III/V semiconductor compounds, or any other suitable semiconductor material. Furthermore, semiconductor 100 may be formed into wafers or substrates. The electronics 102, may be any suitable electronic circuits for which it may be desirable to isolate individual components or modules of circuitry, for example and not by way of limitation, a circuit and some transistors or many transistors, or many circuits, or high voltage transistors formed in the surface of semiconductor 100. The electronics 102 may be identical electronic circuits, individually unique, or any combination thereof. The electronics 102 may be formed using any suitable semiconductor manufacturing process for any suitable function or purpose. FIG. 1A also illustrates an insulator 104. Insulator 104 may be any suitable insulating material, for example and not by way of limitation, ceramic, glass, or silicon.

Figure 1B:
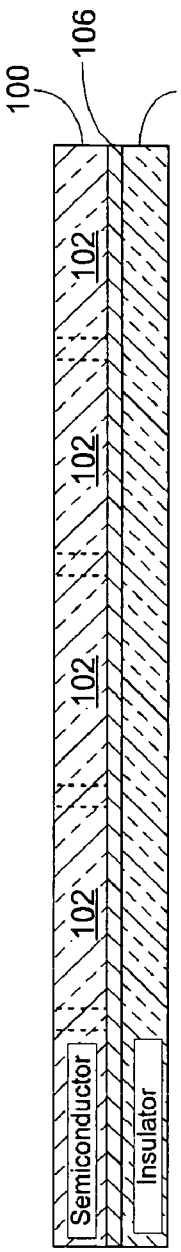

FIG. 1B illustrates using an adhesive 106 to bond the semiconductor 100 to the insulator 104. The adhesive 106 may be any non-conducting adhesive suitable for bonding electronic components together. For example and not by way of limitation, a variety of suitable semiconductor adhesive materials are available from 3M, St. Paul, Minn., including bonding films and tapes, light cure and epoxy adhesives. Other suitable bonding techniques may include anodic and silicon/SiO$_2$ bonding as known to those of skill in the art.

Figure 1C:
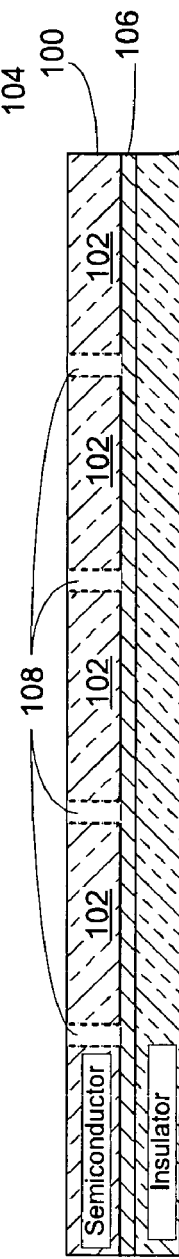

FIG. 1C is an illustration of physically separating or "trenching" the high voltage electronics from one another on the semiconductor. Trenching may be achieved by any suitable method, for example and not by way of limitation, wet etching, dry etching, vapor etching, gas etching, plasma etching and deep reactive ion etching (DRIE) to create physical air gaps or trenches 108 (four trenches shown in FIG. 1C) between the components according to embodiments of the inventive process. A particular wet etch solution which may be used for trenching is ethylenediamine-pyrocatechol-water solution (EDP). EDP solution etches silicon along its crystalline axis.

In order to reduce the time necessary to perform trenching, the semiconductor 100 may be thinned using any suitable wafer thinning process known to those skilled in the art. Thinning may be performed before or after trenching according to embodiments of the present invention. Note trenching, sawing and/or dicing may be each used alone or in combination to achieve and realize higher voltage devices according to embodiments of the processes disclosed herein.

The air gaps or trenches 108 formed by the trenching may further be back-filled or coated with a suitable insulating material if desired (not shown in FIG. 1C). Back-filling may include depositing the high dielectric breakdown materials using, for example and not by way of limitation, screen printing, ink jetting, micromachining, chemical vapor deposition (CVD) and physical vapor deposition (PVD).

It is desirable to minimize spacing (trench width) between any two adjacent islands of electronics 102 in order to minimize the overall integrated circuit size. Trench widths as narrow as 30 µm or less are desirable for this reason. The dielectric strength of air ranges from about 33 KVAC/cm to 57 KVAC/cm. Therefore, a 30-50 µm air gap (trench 108) is unlikely to withstand 1200 V and higher voltage biases in the absence of conducting media between islands. Therefore, air gaps or trenches 108 are preferably back-filled with a high dielectric breakdown molding compound, according to embodiments of the present invention. Various back-fill materials are suitable for the processes of the present invention, for example and not by way of limitation, Parylene (i.e., Parylene N, C and D, also sometimes referred to as "Paralyne"), and cyanoacrylate (the chemical name for Super Glue™). Parylene is a unique polymer conformal coating that conforms to virtually any shape, including crevices, points, sharp edges, and flat, exposed internal surfaces. Parylene N for example, has dielectric strength of 7000 V/mil. Thus, Parylene N is particularly suitable as a back-fill material for use with trenches having widths in the 10-50 µm range. Parylene N may be vacuum-deposited onto the surfaces of electronics and semiconductor wafers using known processes.

Back-filling trenches 108 may also be achieved by conformal coating of the electronics 102 and trenches 108. Conformal coating is the process of spraying a dielectric material onto a device component to, among other things, protect it from moisture, fungus, dust, corrosion, abrasion, and other environmental stresses. Common conformal coatings suitable for filling in the trenches 108 may, for example and not by way of limitation, include silicone, acrylic, urethane, epoxy and Parylene. These coatings can typically increase the dielectric breakdown. By physically separating the electronics 102 by trenching and back-filling the trenches 108, there is less chance that the operation of one of the electronics 102 will unintentionally affect the operation of other nearby electronics 102. Furthermore, trenching and back-filling generally increases breakdown voltage, $V_{bd}$, relative to trenching alone.

Figure 1D:
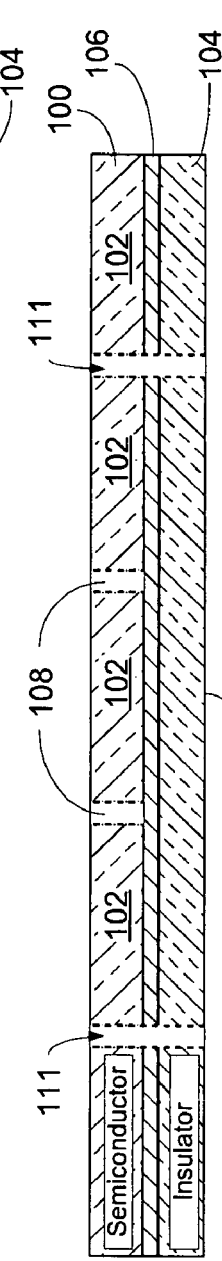

FIG. 1D is an illustration of die separation or "dicing" of the bonded semiconductor 100 and insulator 104 to form an insulated module 110. The insulated module 110 may be, for example and not by way of limitation, a circuit with any suitable number of low or high voltage transistors, or any suitable number of electronic circuits for performing any selected function. As known to those skilled in the art, die separation is the process of cutting (shown generally as gaps 111) a semiconductor wafer into dies (chips) each containing a complete semiconductor device or circuit. Dicing may follow completion of device (both discrete and integrated) fabrication. In the case of a large diameter semiconductor, wafer dicing may be carried out by partially cutting the wafer along preferred crystallographic planes using a high precision saw with an ultra-thin diamond blade. Though only one insulated module 110 is shown as a die in FIG. 1D, it will be readily apparent to those of ordinary skill in the art that multiple insulated modules 110 may be separated from the original bonded semiconductor 100 and insulator 104. The dicing may be performed by any suitable method for dicing electronic components.

Figure 1E:
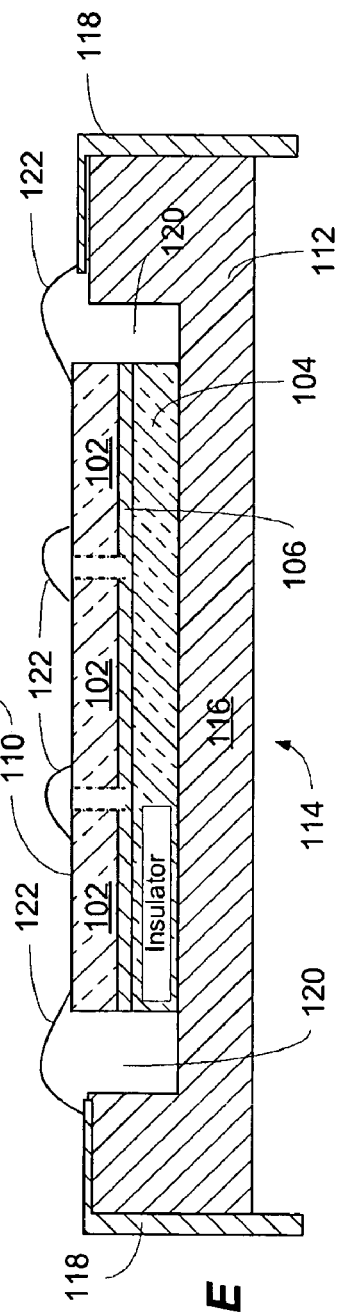

FIG. 1E is an illustration of die attaching and wire-bonding in order to form an integrated circuit 114, according to the present invention. Die attaching is the process of attaching the insulated module 110 to a chip carrier 112. Die attaching may be achieved, for example, using any of the adhesives discussed above regarding bonding the semiconductor 100 and insulator 104. The chip carrier 112 may be formed using any suitable chip carrier technology or architecture. Chip carrier 112 shown in FIG. 1E may include a chip carrier substrate 116 and one or more leads 118 (two shown in FIG. 1E).

Wire-bonding is a process whereby the electronic circuits 102 of the insulated module 110 may be connected to one another and externally connected to the chip carrier 112. As shown in FIG. 1E, wires 122 (four shown in FIG. 1E) may be used to connect the insulated module 110 to leads 118 on the chip carrier 112 or to interconnect electronics 102 formed in the semiconductor 100. The wire-bonding may be performed by any suitable means known to those skilled in the art of, for example, semiconductor fabrication. Furthermore, while wire-bonding is illustrated as a method for electrically connecting the insulated module 110 (die) to the chip carrier 112, those skilled in the art will readily recognize that other methods of electrically connecting the die to the chip carrier 112, e.g., flip-chip assemblies, are also suitable methods according to the present process.

Once the die has been attached and the insulated module 110 electrically connected to the chip carrier 112, for example using wire-bonding or flip-chip techniques, there may be air gaps 120 between the insulated module 110 and the chip carrier 112. Conformal coating (as discussed above) may be used to seal the integrated circuit 114 at this point in the process. The process of conformal coating, passivation, encapsulating, or otherwise sealing the integrated circuit 114 is not shown in FIGS. 1A-1E for clarity of the illustration, but is often generally necessary to finish the packaging of the integrated circuit 114 prior to use. Where back-filling of trenches 108 has covered electrical pads (not shown) on the surface of the insulated module 110, the pads may need to be prepared by removing the conformal coating prior to wire-bonding. In any case, after wire-bonding, the wire-bonded integrated circuit 114 generally requires conformal coating.

These chip carriers 112 (or packages) may be any suitable commercial packages, including for example and not by way of limitation plastic or ceramic packages with various lead configurations. However, it is typically necessary that chip carriers 112 have wider inter-lead spacing (lead pitch) than those of low voltage packages. For example, lead pitches in the range of about 200 µm to about 400 µm are typically employed for high voltage operation of around 1000 V. Alternatively, the high voltage pin in the opposite side of the package from the low voltage pin can be used if a conventional low voltage package with standard pad spacing is used to achieve around 1000 V high voltage operation. Of course, these are merely illustrative examples provided for explanation of the inventive methods and are not intended to be limiting.

Electronics 102 may be provided with any desired form or function according to any suitable fabrication process. High voltage electronic circuits are particularly suitable for this embodiment of a process for integrating electronics according to the present invention. However, the process described herein is not limited to high voltage electronics. The number of transistors and circuits included in the electronics 102 necessary to form the insulated module 110 may depend upon the operation voltage desired and the operation voltage of the low and high voltage transistors and circuits used to make the insulated module 110. Where it is desired to have an insulated module 110 capable of operating at high voltages that is formed of low voltage transistors and circuits, a higher number of low voltage transistors or circuits operating in series, parallel, or any other configuration may be required to achieve the high voltage operation.

FIGS. 2A-2D are illustrations of another embodiment of a process for integrating electronics, particularly high voltage electronics, using polyimide insulating materials according to the present invention. Polyimide is a type of plastic (a synthetic polymeric resin) originally developed by DuPont™, that is very durable, easy to machine and can handle very high temperatures. Polyimide is also highly insulative and does not contaminate its surroundings, i.e., does not outgas under normal operating conditions. Vespel™ and Kapton™ are trademarks for exemplary polyimide products that are available from DuPont™.

Figure 2A:
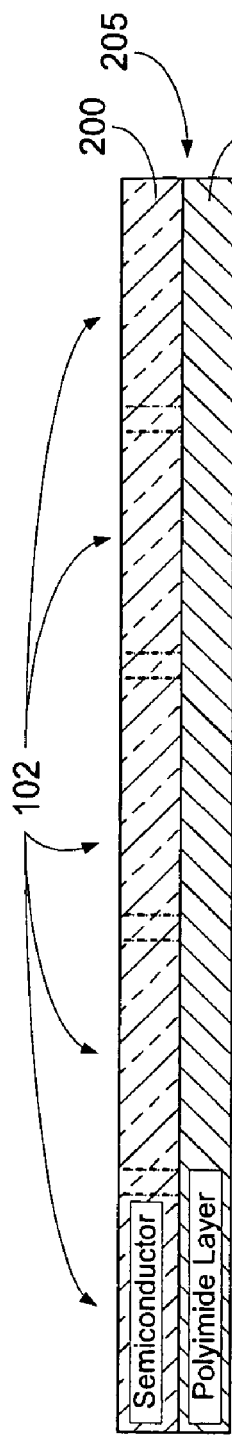
FIGS. 2A-2D are illustrations of an embodiment of a process for integrating electronics using a thick polyimide layer according to the present invention.

Referring to FIG. 2A, a semiconductor substrate 200 having electronics (shown generally at 102) formed therein is shown with a thick polyimide, layer 203 underneath. The semiconductor substrate 200 and polyimide layer 203 together, form an insulated wafer (indicated generally at 205). The semiconductor substrate 200 may be formed of silicon or any other semiconductor material such as those enumerated above with regard to FIGS. 1A-1E. The insulating polyimide layer 203 may be applied to the semiconductor substrate 200 in any suitable manner known to those skilled in the art of semiconductor fabrication, for example and not by way of limitation, microelectromechanical systems (MEMS), microfabrication, micromachining, screen printing, ink jetting techniques, thermal deposition, chemical vapor deposition, and physical vapor deposition, and any other suitable technologies.

Figure 2B:
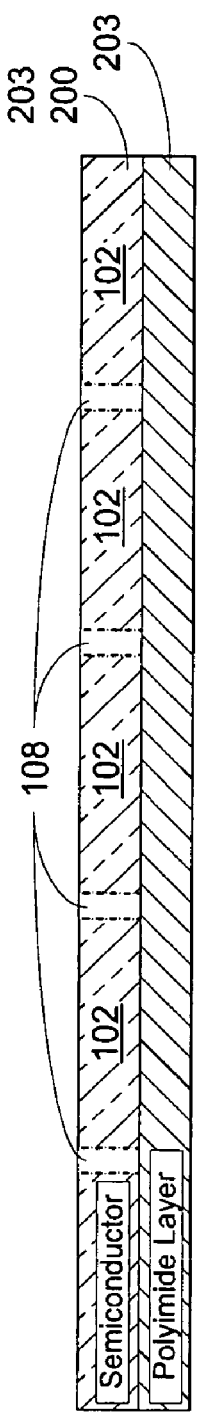

FIG. 2B is a cross-sectional illustration of an exemplary insulated wafer 205 with electronics 102 that have been trenched or physically separated by trenches 108. Trenching may be performed as described above with regard to FIG. 1C. Conformal coating or back-filling the trenches 108 as described above may also be applied to further isolate and increase the breakdown voltage, $V_{bd}$, of the electronics 102.

Figure 2C:
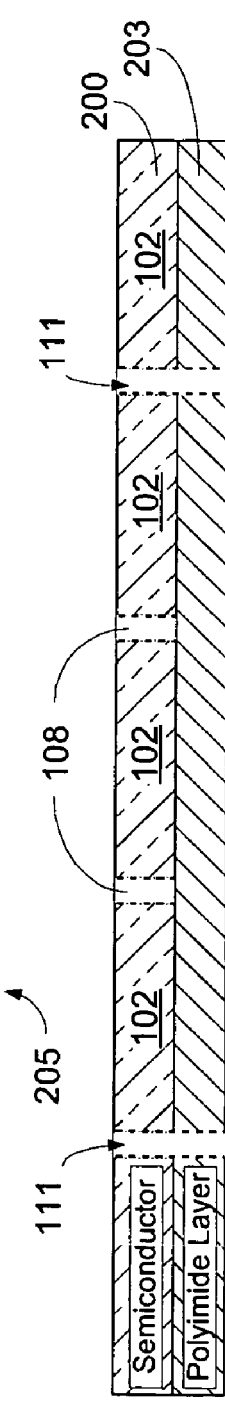

FIG. 2C is a cross-sectional illustration of dicing of the insulated wafer 205 to obtain insulated modules 210 (one shown in FIG. 2C). Again the dicing may be performed using any suitable dicing methodology, for example those described with reference to FIG. 1D above. Dicing may follow completion of device (both discrete and integrated) fabrication. In the case of a large diameter semiconductor, wafer dicing may be performed by partially cutting the wafer along preferred crystallographic planes using a high precision saw with ultra-thin diamond blade. Though only one insulated module 210 is illustrated in FIG. 2C, it will be readily apparent to those of ordinary skill in the art that multiple insulated modules 210 may be separated from the original insulated wafer 205. Also, multiple insulating layers can be used according to another embodiment. The dicing and separating of insulated modules 210 may be performed by any suitable method for dicing, etching, or separating electronic components known to those skilled in the art.

Figure 2D:
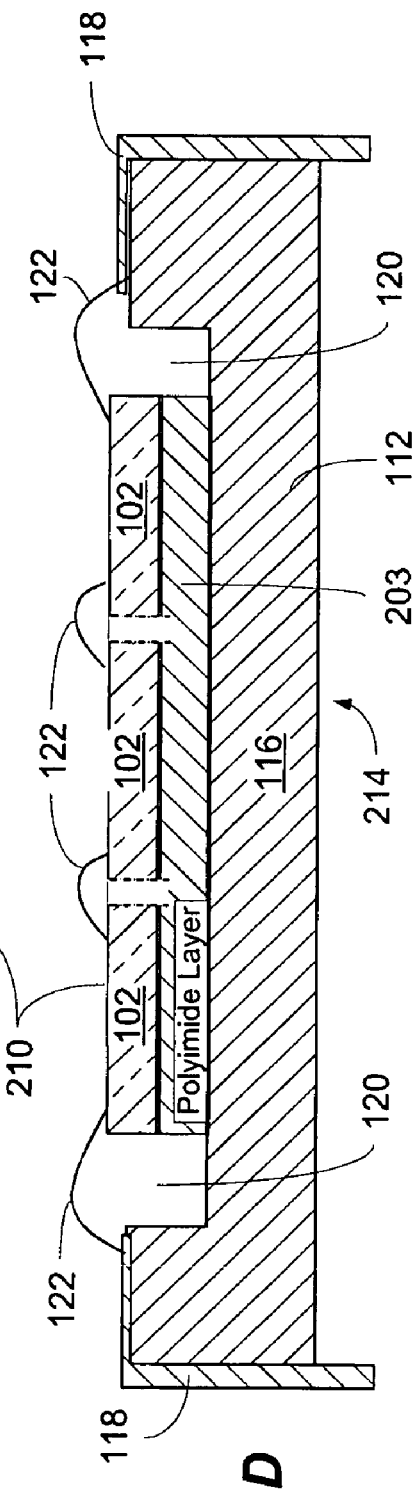

FIG. 2D is an illustration of die attaching and wire-bonding of the insulated module 210 to a chip carrier 112 in order to form an integrated circuit 214. Again, the chip carrier 112 may be any suitable chip carrier as described above with reference to FIG. 1E, for example. Similarly wire-bonding, illustrated as wires 122 interconnecting the electronics 102 with each other and leads 118 on the chip carrier 112, may be performed by any suitable means. Finally, the integrated circuit 214 may be conformal coated, back-filled, encapsulated, or otherwise sealed (not shown in FIGS. 2A-2D) to fill the air gaps 120 and finish the packaging prior to use. To increase product reliability, it is important to passivate the wire-bonds with some sort of insulator. Parylene and cyanoacrylate (the chemical name for Super Glue™) are examples of particularly suitable passivation materials. After the passivation, the final plastic or ceramic packaging step may be performed.

Back-filling and passivation may be achieved by other materials such as photoresist materials with a dielectric strength in the high hundreds of kV/cm to ~1 MV/cm or more that are suitable for increasing breakdown voltage while still reducing island spacing (trench width). Various patternable polymers include, for example and not by way of limitation, SU-8 (an epoxy based negative photoresist) and polymethyl methacrylate (PMMA) available from many sources including Micro-Chem, Newton, Mass., and polydimethylsiloxane (PDMS), also available from many sources. SU-8, PMMA and PDMS all have high dielectric strength. PDMS, for example, has been reported to have a dielectric strength of 210 KV/cm. PDMS is also quite suitable for bonding plastic materials to a silicon wafer. Sumitomo Chemical, Japan, is another source for additional molding compounds which may be suitable for back-filling according to the present invention.

Table 1 below shows experimental data on breakdown voltage, $V_{bd}$, for two trench widths and for two back-fill materials, i.e., air gaps (no dielectric back-fill) and cyanoacrylate (Super Glue™).

TABLE 1

Experimental Data on Breakdown Voltage, $V_{bd}$.

| Test No. | Trench Spacing (μm) | Breakdown Voltage, $V_{bd}$, (V) | Back-fill Material between Islands | Dielectric Strength (KVDC/cm) |
|---|---|---|---|---|
| 1 | 22 | 198 | Air | 90 |
| 2 | 22 | 756 | Super Glue ™ | 378 |
| 3 | 51 | 1250 | Super Glue ™ | 250 |

Figure 3:
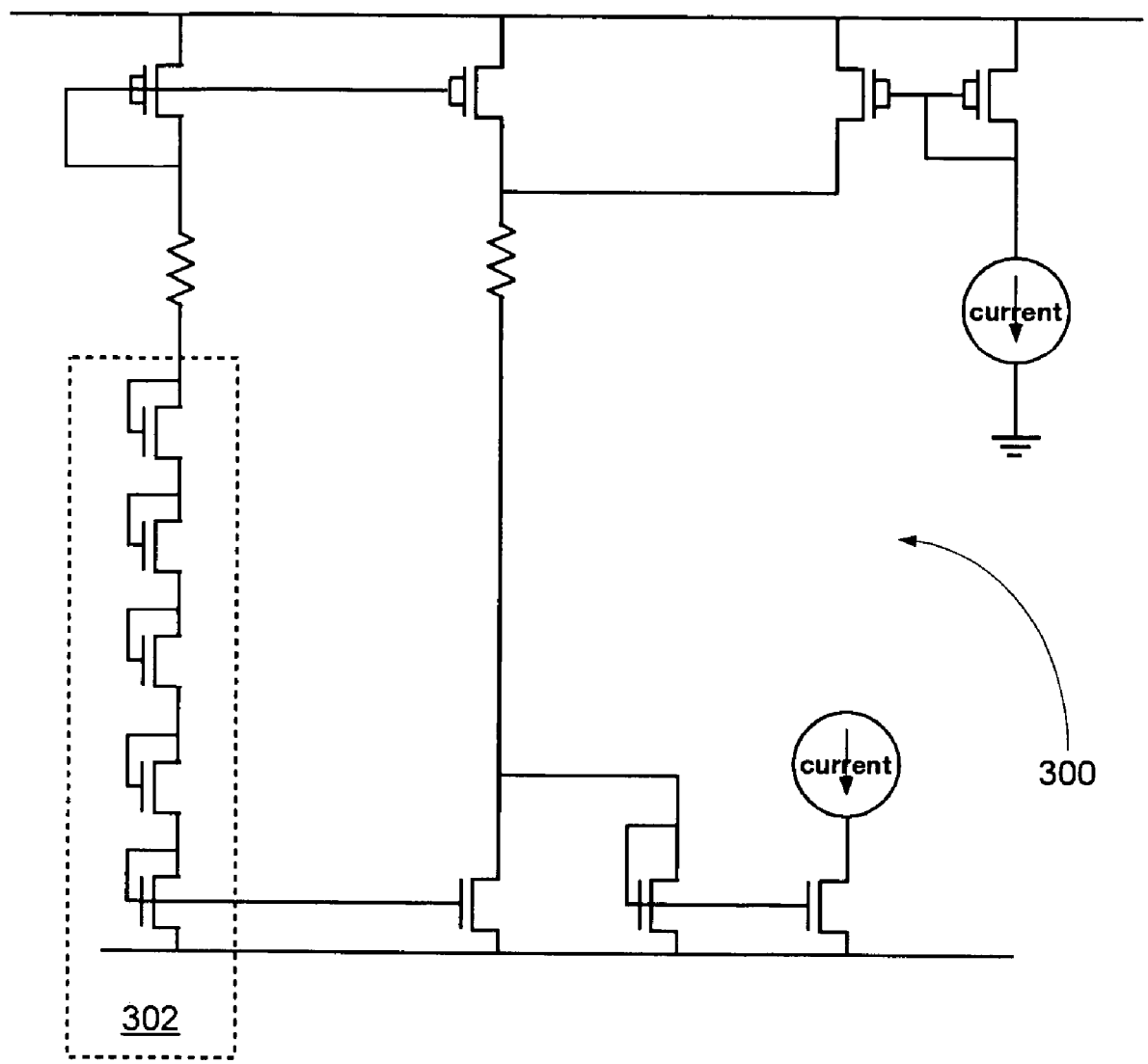
FIG. 3 is a circuit diagram of an exemplary high voltage circuit, specifically a high voltage current source with stacked high voltage transistors, suitable for integration by processes according to the present invention.

The processes disclosed herein are particularly suitable for integrating low voltage electronic devices to form high voltage ICs, high voltage electronic devices and circuits. FIG. 3 is a circuit diagram of an exemplary high voltage circuit, specifically a high voltage current source 300 with stacked low voltage transistors (shown in dotted line box 302), suitable for integration by the processes described above.

Another feature according to the present invention is the formation of high value polysilicon (poly) resistors over the drift region of a transistor. For example, when a conventional complementary metal oxide semiconductor (CMOS) foundry process is used with the inventive processes, a high value poly resistor may be placed over the drift region of a transistor. This poly resistor acts like a distributed field plate, thus enhancing the breakdown voltage of the transistor. This poly resistor may also act as a high voltage stacked resistor element for the desired integrated circuit, and will eliminate the need for additional area for the resistor.

Figure 4A:
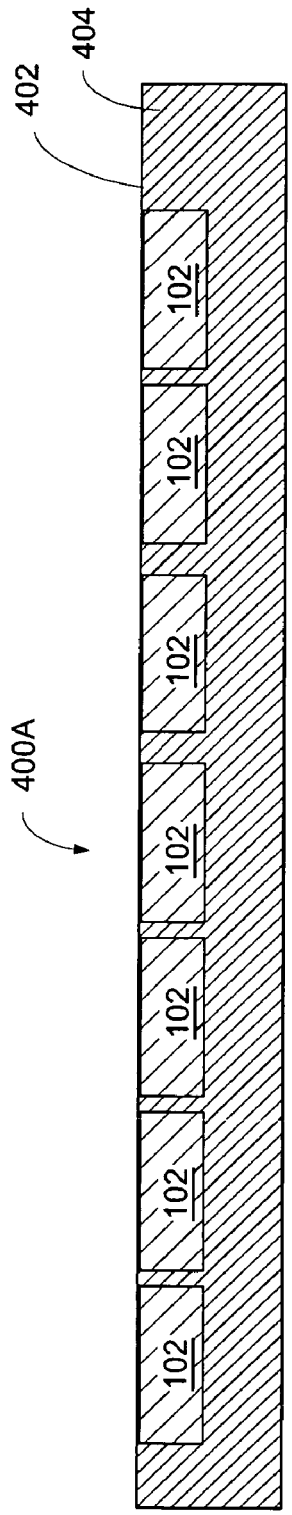
FIGS. 4A-4F are illustrations of another embodiment of a process for integrating electronics according to the present invention.

Referring now to FIGS. 4A-F, another embodiment of a process for integrating electronics according to the present invention will be discussed in detail. FIG. 4A is a section view of a finished semiconductor wafer, shown generally by arrow 400A, that has been processed to introduce electronics 102 into a surface 402 of a substrate 404. The semiconductor wafer 400A may be, for example and not by way of limitation, a CMOS processed wafer, or any other semiconductor wafer processed according to any conventional semiconductor fabrication process.

Figure 4B:
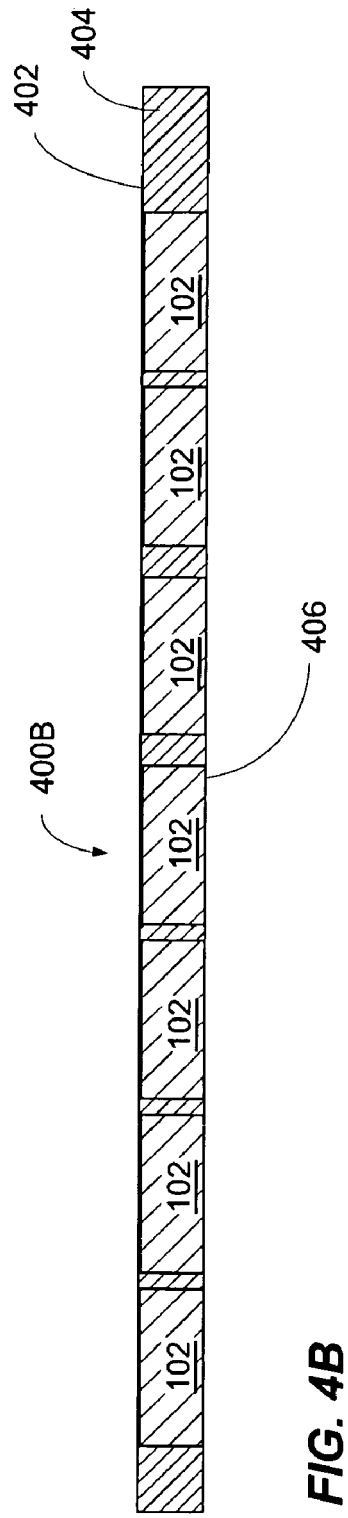

FIG. 4B is a section view of a thinned wafer, shown generally by arrow 400B. Thinned wafer 400B may be obtained by removing excess substrate material from finished semiconductor wafer 400A by grinding, etching, or any other suitable means for thinning a semiconductor wafer known to those of skill in the art. For example, thinning may be achieved by applying a grinding tape to the surface 402 where the electronics 102 are located and using abrasives to grind the opposite side 406 of the substrate 404 to a suitable thickness.

Figure 4C:
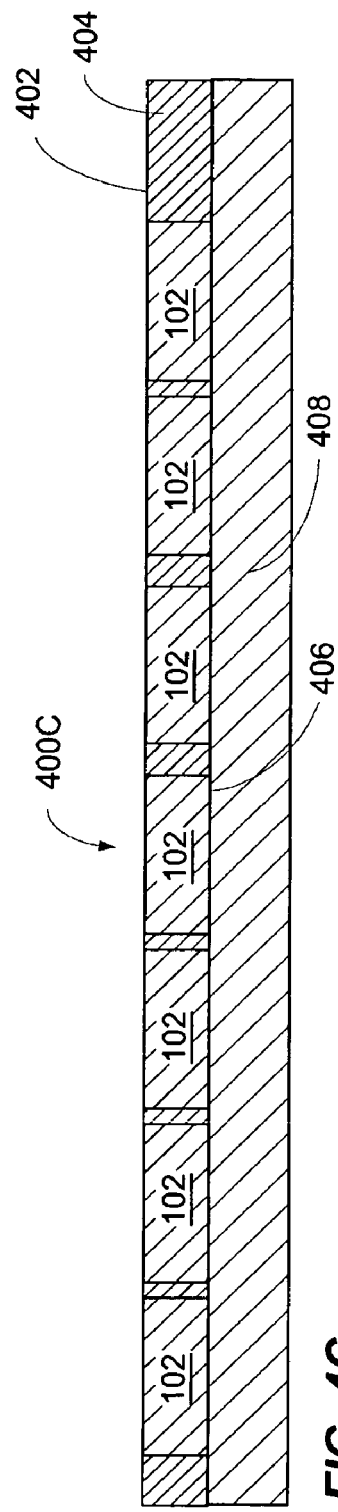

FIG. 4C is a section view of a supported wafer, shown generally by arrow 400C. Supported wafer 400C may be obtained by attaching a support substrate 408, or for example, an electronics package (not shown) to the opposite side 406 of thinned wafer 400B. Adhesives or any other suitable means may be used to attach support substrate 408 to the opposite side 406 of thinned wafer 400B. Support substrate 408 may be an insulating or dielectric substrate to further isolate electronics 102.

Figure 4D:
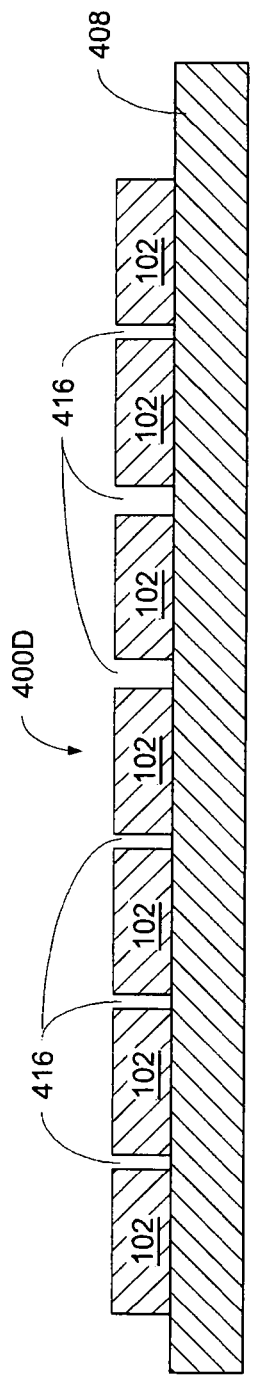

FIG. 4D is a section view of a diced wafer, shown generally by arrow 400D. Diced wafer 400D may be obtained by dicing electronics 102 formed on the supported wafer 400C by sawing, etching, or any other suitable means for physically separating electronics 102 from one another, but yet still supported on support substrate 408, as disclosed herein and also known to those skilled in the art.

Figure 4E:
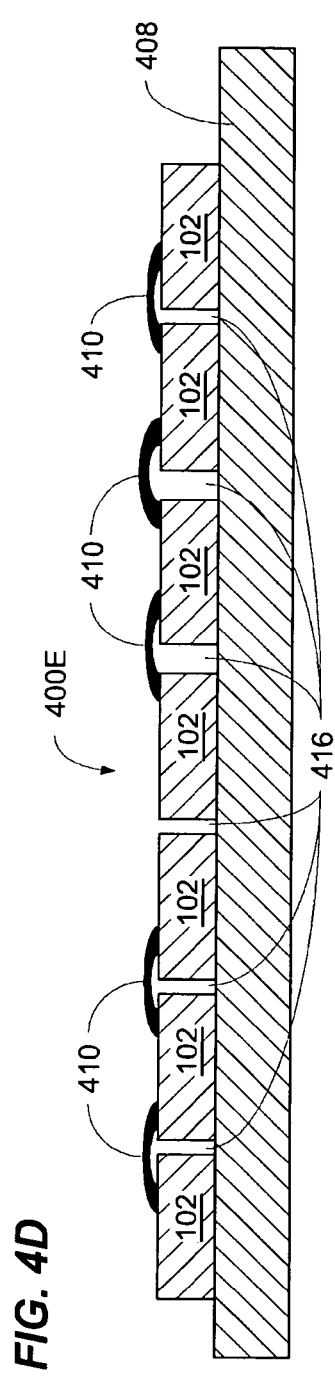

FIG. 4E is a section view of an interconnected wafer, shown generally by arrow 400E. Interconnections between electronics 102 and to a chip carrier (not shown in FIG. 4E, but see FIG. 4F and related discussion below) for packaging may be in the form of wire-bonding 410 as shown in FIG. 4E. However, any suitable means for achieving electrical interconnects between electronics 102 and packaging (not shown in FIG. 4E) are within the scope of the present invention.

Figure 4F:
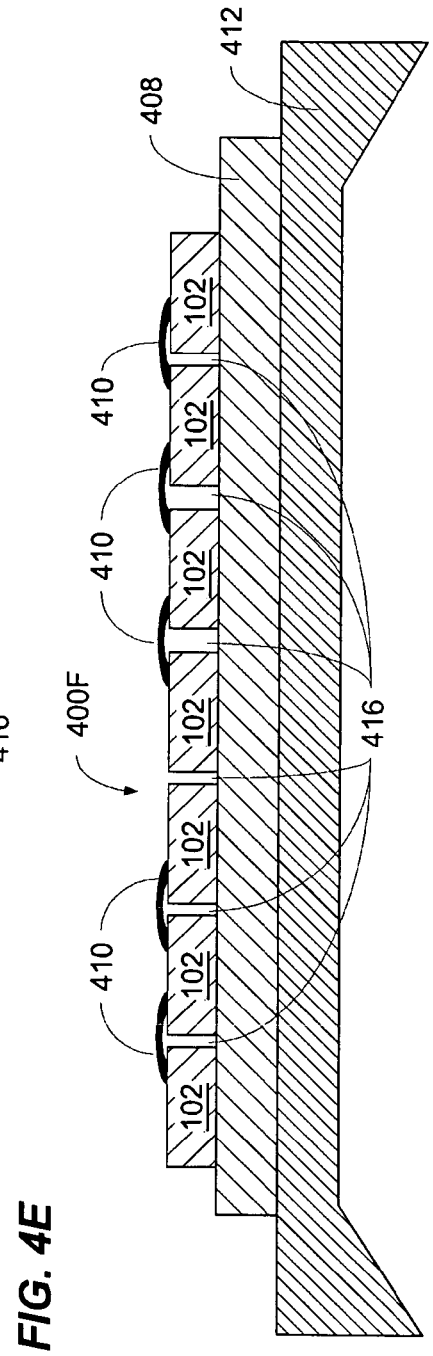

FIG. 4F is a section view of a mounted wafer, shown generally by arrow 400F. Mounted wafer 400F may be obtained by mounting interconnected wafer 400E onto a chip carrier 412 or other electronics package (not shown). Note that the interconnecting shown in FIG. 4E may be performed after mounting shown in FIG. 4F. Any suitable adhesive or adhesive tape may be used to mount interconnected wafer 400E onto chip carrier 412. Finally, the mounted wafer may be back-filled, passivated and/or sealed with a conformal coating and packaged as an integrated circuit, as described above.

Figure 5A:
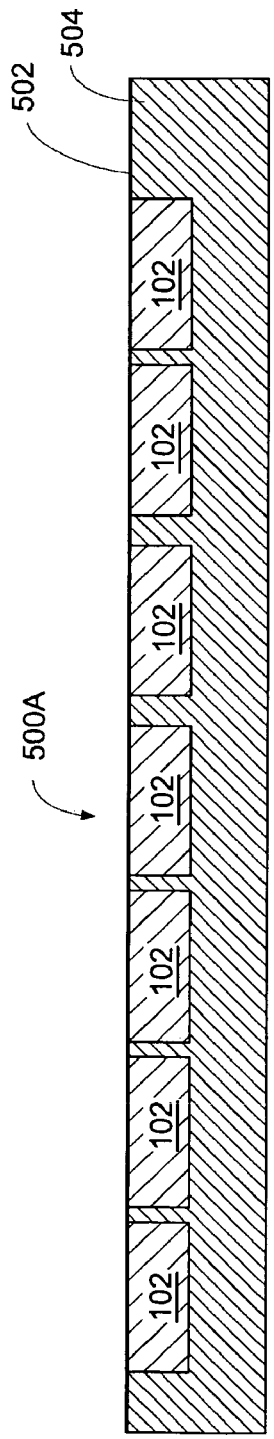
FIGS. 5A-5F are illustrations of yet another embodiment of a process for integrating electronics according to the present invention.

Referring now to FIGS. 5A-F, yet another embodiment of a process for integrating electronics according to the present invention will be discussed in detail. FIG. 5A is a section view of a finished semiconductor wafer, shown generally by arrow 500A, that has been processed to introduce electronics 102 into a top surface 502 of a substrate 504. The semiconductor wafer 500A may be, for example and not by way of limitation, a CMOS processed wafer like 400A shown in FIG. 4A, or any other semiconductor wafer processed according to any conventional semiconductor fabrication process.

Figure 5B:
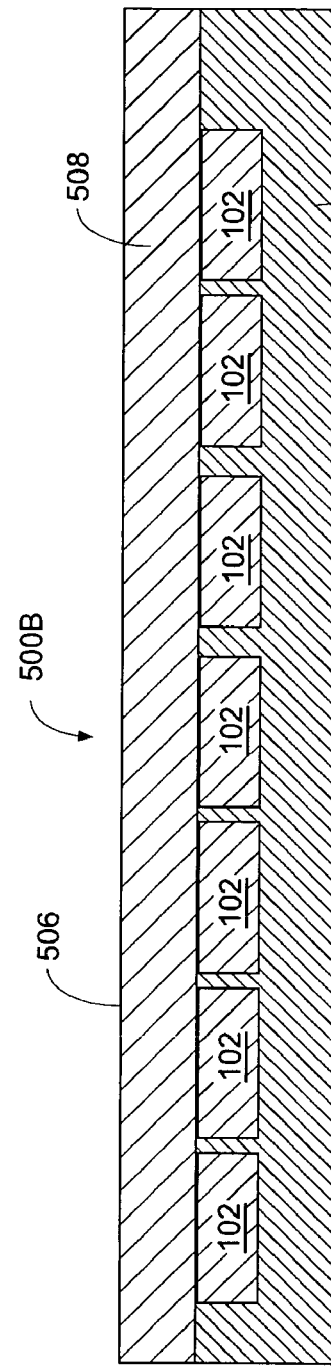

FIG. 5B is a section view of a supported wafer, shown generally by arrow 500B. Supported wafer 500B may be obtained by attaching a support substrate 508 to the top surface 502 of semiconductor wafer 500A. Adhesives or any other suitable means may be used to attach support substrate 508 to the top surface 502 of semiconductor wafer 500A. Support substrate 508 may be an insulating or dielectric substrate to further isolate electronics 102.

Figure 5C:
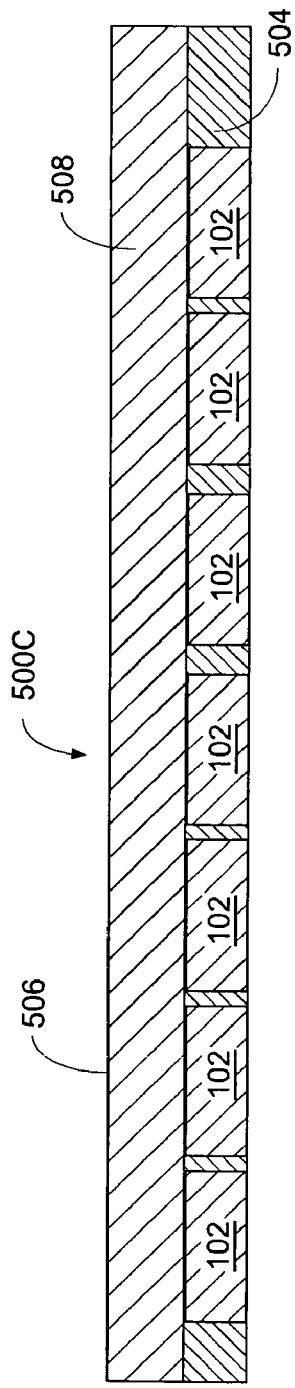

FIG. 5C is a section view of a thinned wafer, shown generally by arrow 500C. Thinned wafer 500C may be obtained by removing excess substrate 504 material from supported wafer 500B by grinding, etching, or any other suitable means for thinning a semiconductor wafer known to those of skill in the art. For example, thinning may be achieved by applying a grinding tape to the opposite side 506 of the supported wafer 500B and using abrasives to grind substrate 504 to a suitable thickness. Note that according to another embodiment, the wafer thinning shown in FIG. 5C may be accomplished prior to attaching the support substrate 508, as shown in FIG. 5B, to the front of the semiconductor wafer 500A.

Figure 5D:
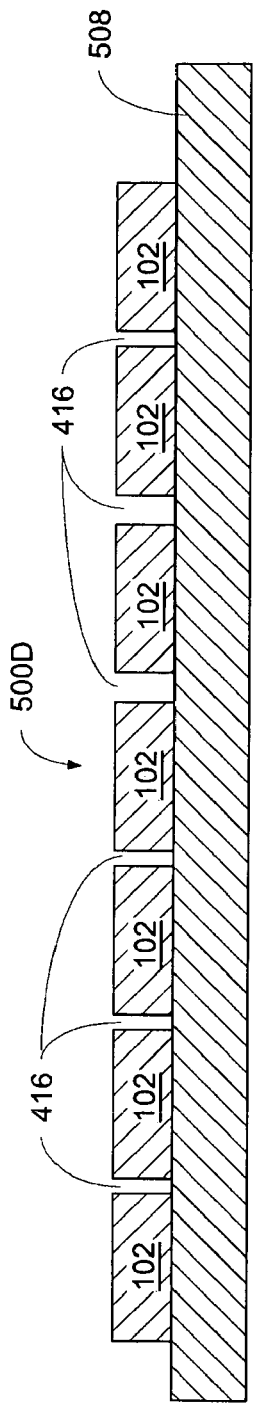

FIG. 5D is a section view of a diced wafer, shown generally by arrow 500D. Diced wafer 500D may be obtained by inverting (flipping) thinned wafer 500C and dicing electronics 102 formed on the thinned wafer 500C by sawing, etching, or any other suitable means for physically separating electronics 102 from one another, thereby introducing gaps 416. It will be apparent that the diced electronics 102 may still be supported on support substrate 508, as disclosed herein and also known to those skilled in the art.

Figure 5E:
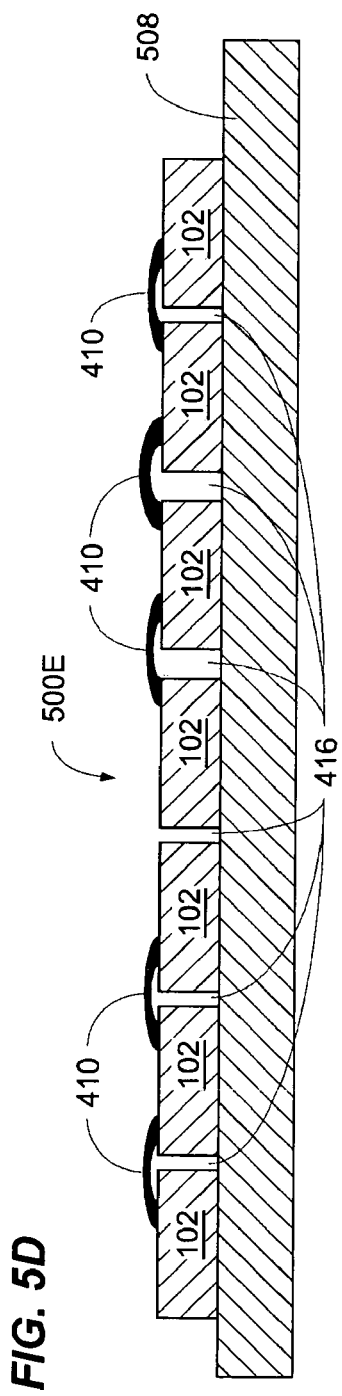

FIG. 5E is a section view of an interconnected wafer, shown generally by arrow 500E. Interconnections between electronics 102 and to a chip carrier (not shown in FIG. 5E, but see FIG. 5F and related discussion below) for packaging may be in the form of wire-bonding 410 as shown in FIG. 5E. However, any suitable means for achieving electrical interconnects between electronics 102 and packaging (not shown in FIG. 4E) are within the scope of the present invention. According to another embodiment, gaps 416 may be back-filled, passivated, or conformal coated (not shown in FIG. 5E) to further isolate electronics 102 and stabilize wire-bonds 410 according to methods and materials described above.

Figure 5F:
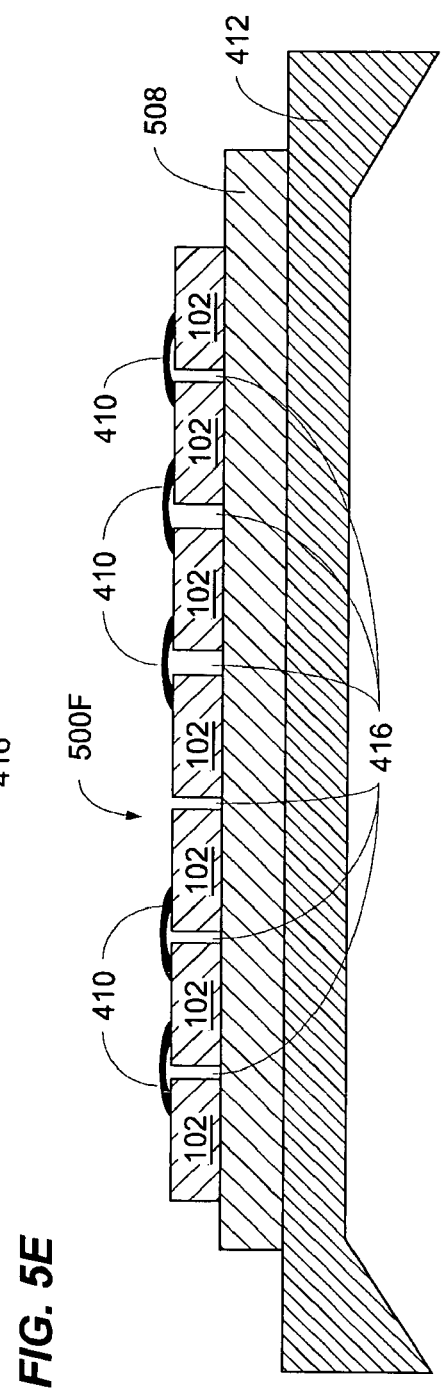

FIG. 5F is a section view of a mounted wafer, shown generally by arrow 500F. Mounted wafer 50OF may be obtained by mounting interconnected wafer 500E onto a chip carrier 412. Note that the interconnecting shown in FIG. 5E may be performed after mounting shown in FIG. 5F. Any suitable adhesive or adhesive tape may be used to mount interconnected wafer 500E onto chip carrier 412. Finally, the mounted wafer may be back-filled, passivated, or sealed with a conformal coating and packaged as an integrated circuit, as described above.

Figure 6A:
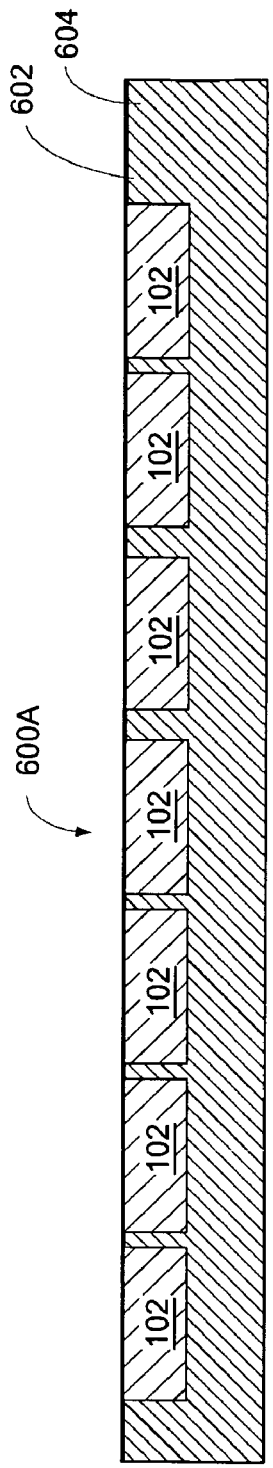
FIGS. 6A-6E are illustrations of still another embodiment of a process for integrating electronics according to the present invention.

Referring now to FIGS. 6A-E, still another embodiment of a process for integrating electronics according to the present invention will be discussed in detail. FIG. 6A is a section view of a finished semiconductor wafer, shown generally by arrow 600A, that has been processed to introduce electronics 102 into a top surface 602 of a substrate 604. The semiconductor wafer 600A may be, for example and not by way of limitation, a CMOS processed wafer, or any other semiconductor wafer processed according to any conventional semiconductor fabrication process.

Figure 6B:
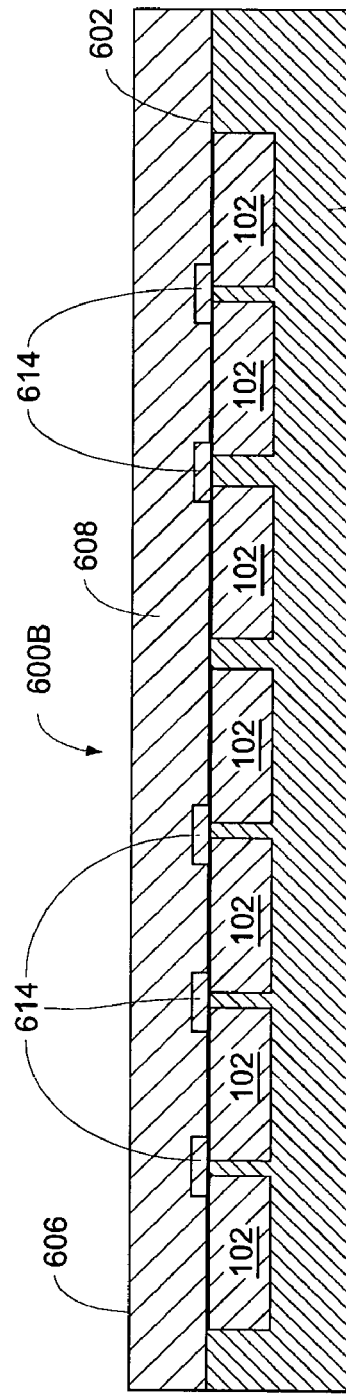

FIG. 6B is a section view of a patterned supported wafer, shown generally by arrow 600B. Patterned supported wafer 600B may be obtained by attaching a patterned support substrate 608 having patterned interconnects 614 adjacent to the top surface 602 of semiconductor wafer 600A. Adhesives or any other suitable means may be used to attach patterned support substrate 608 to the top surface 602 of semiconductor wafer 600A. Support substrate 608 may be an insulating or dielectric substrate to further isolate electronics 102. However, patterned support substrate 608 is patterned with interconnects for selectively interconnecting electronics 102 to each other.

Figure 6C:
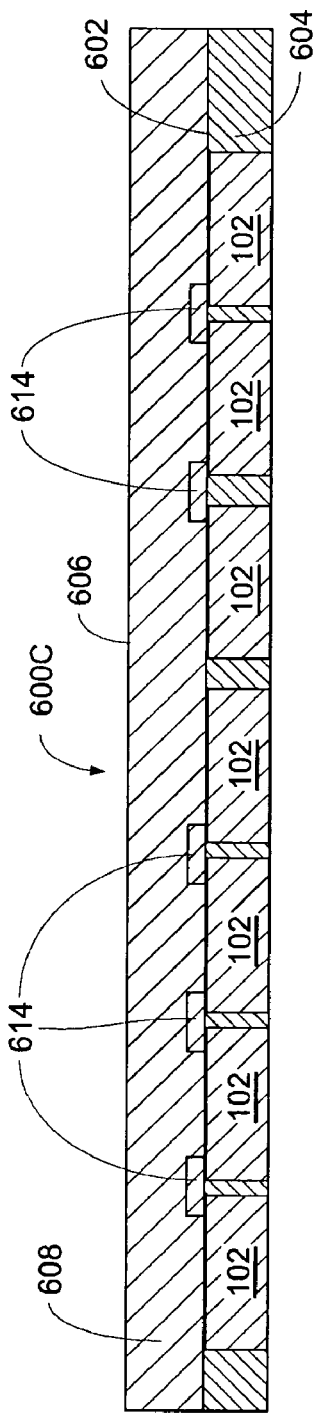

FIG. 6C is a section view of a thinned wafer, shown generally by arrow 600C. Thinned wafer 600C may be obtained by removing excess substrate 604 material from patterned supported wafer 600B by grinding, etching, or any other suitable means for thinning a semiconductor wafer known to those of skill in the art. For example, thinning may be achieved by applying a grinding tape to the opposite side 606 of the patterned supported wafer 600B and using abrasives to grind substrate 604 to a suitable thickness. Note that according to another process embodiment, the wafer thinning shown in FIG. 6C may be accomplished prior to attaching of the patterned support substrate 608, as shown in FIG. 6B, to the front of the semiconductor wafer 600A.

Figure 6D:
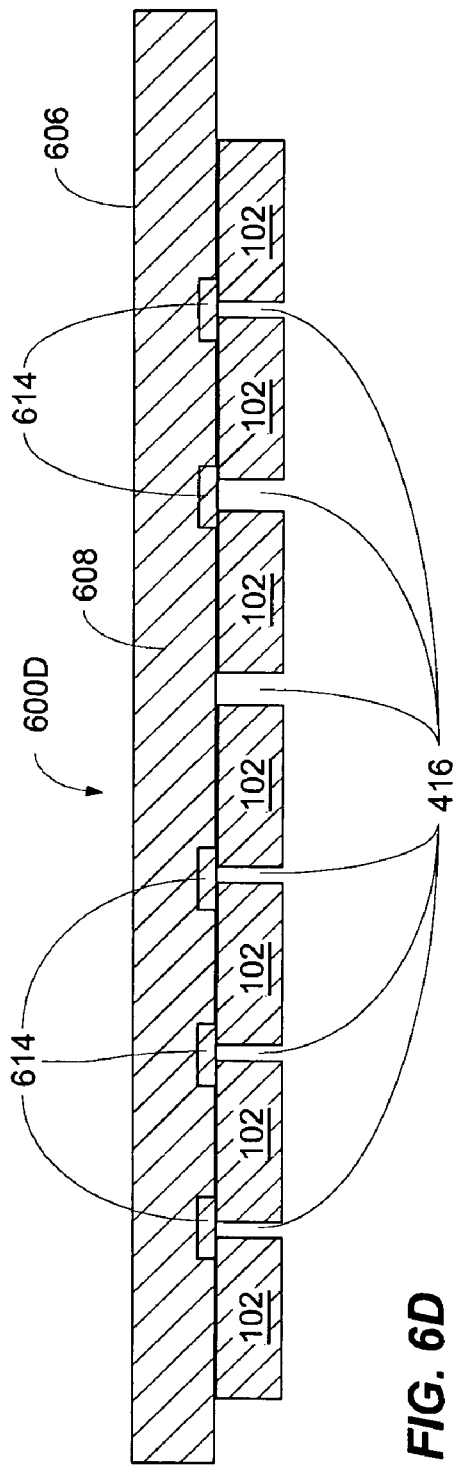

FIG. 6D is a section view of a diced wafer, shown generally by arrow 600D. Diced wafer 600D may be obtained by dicing electronics 102 formed on the thinned wafer 600C by sawing, etching, or any other suitable means for physically separating electronics 102 from one another. It will be apparent that the diced electronics 102 may still be supported on support substrate 608, as disclosed herein and also known to those skilled in the art. Once the diced wafer 600D is formed, it may be back-filled, passivated, or sealed with a conformal coating to fill in the gaps 416 formed by the dicing process illustrated in FIG. 6D. Note that the back-filling is not shown in FIG. 6D.

Figure 6E:
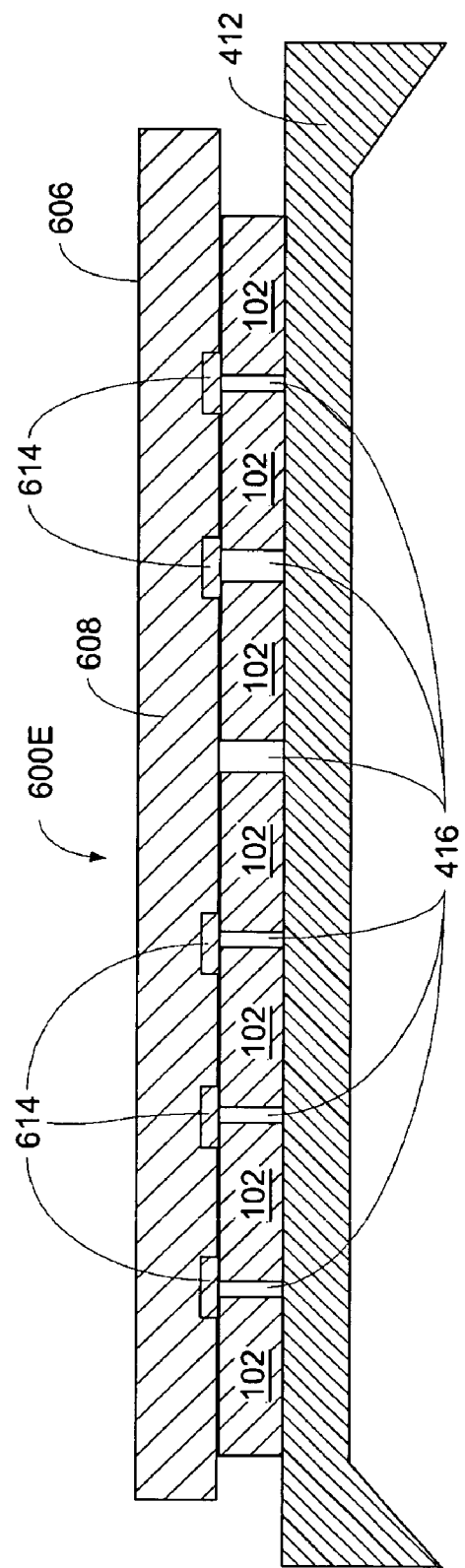

FIG. 6E is a section view of a mounted wafer, shown generally by arrow 600E. Mounted wafer 600E may be obtained by mounting diced wafer 600D onto a chip carrier 412. Note that additional interconnecting (not shown in FIG. 6E) may be performed to electrically connect diced wafer 600D to the chip carrier 412. Any suitable adhesive or adhesive tape may be used to mount diced wafer 600D onto chip carrier 412. Finally, the mounted wafer may be back-filled, passivated, or sealed with a conformal coating and packaged as an integrated circuit, as described above.

Figure 7A:
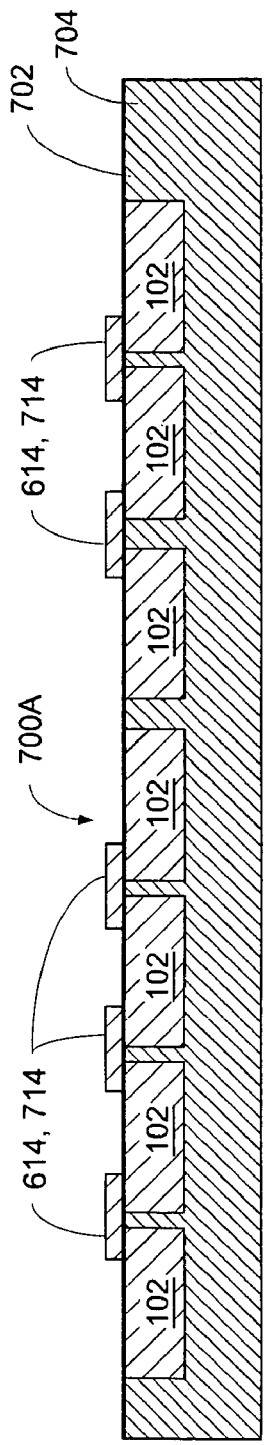
FIGS. 7A-7E are illustrations of a further embodiment of a process for integrating electronics according to the present invention.

Referring now to FIGS. 7A-E, a further embodiment of a process for integrating electronics according to the present invention will be discussed in detail. FIG. 7A is a section view of a finished semiconductor wafer, shown generally by arrow 700A, that has been processed to introduce electronics 102 into a top surface 702 of a substrate 704. Semiconductor wafer 700A may further include polysilicon resistor interconnects 714 formed on the top surface 702 to selectively interconnect electronics 102 to each other. Semiconductor wafer 700A may be, for example and not by way of limitation, a CMOS processed wafer, or any other semiconductor wafer processed according to any conventional semiconductor fabrication process.

Figure 7B:
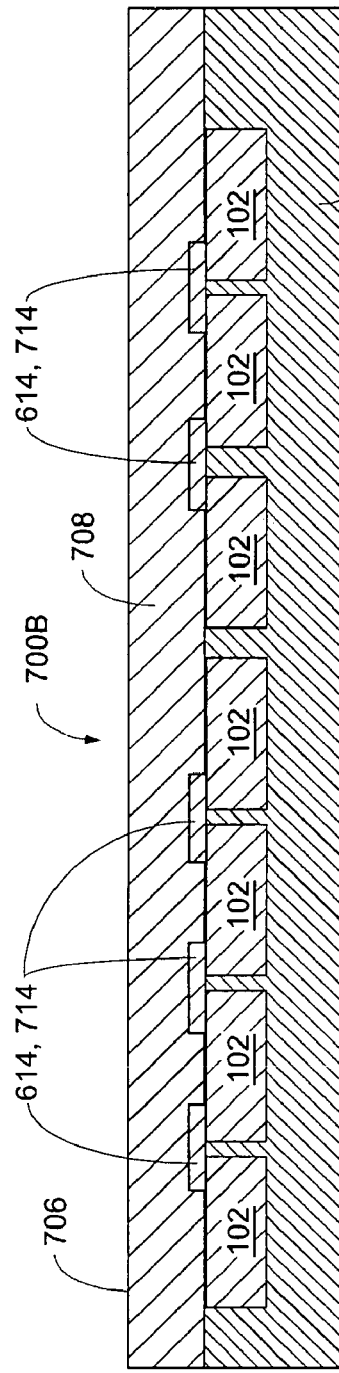

FIG. 7B is a section view of a supported wafer, shown generally by arrow 700B. Supported wafer 700B may be obtained by attaching a support substrate 708 to the top surface 702 of semiconductor wafer 700A. In still another embodiment, support substrate 708 may be further patterned with interconnects similar to patterned interconnects 614 shown in FIGS. 6B-E, for further interconnecting electronics 102. Patterned interconnects 614 may be formed from any suitable conductive material, for example and not by way of limitation, aluminum, gold and platinum. Furthermore, patterned interconnects 614 may be formed according to any suitable deposition process as known to those skilled in the art. Patterned interconnects 614 on support substrate 708 may be aligned before attachment of the support substrate 708 to the semiconductor wafer 700A.

Adhesives or any other suitable means may be used to attach support substrate 708 to the top surface 702 of semiconductor wafer 700A. Support substrate 708 may be an insulating or dielectric substrate to further isolate electronics 102. However, as noted above, support substrate 708 may be selectively patterned with interconnects 614 for further selectively interconnecting electronics 102 to each other, according to another embodiment.

Figure 7C:
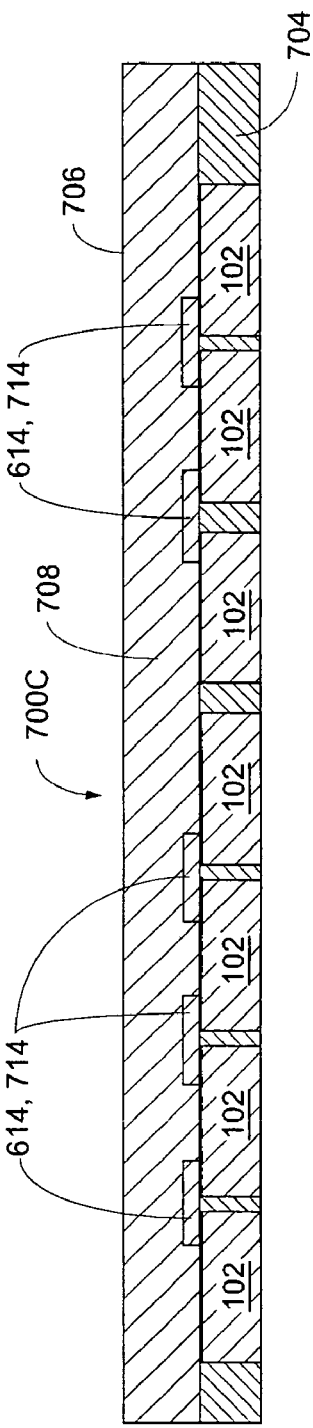

FIG. 7C is a section view of a thinned wafer, shown generally by arrow 700C. Thinned wafer 700C may be obtained by removing excess substrate 704 material from supported wafer 700B by grinding, etching, or any other suitable means for thinning a semiconductor wafer known to those of skill in the art. For example, thinning may be achieved by applying a grinding tape to the opposite side 706 of the supported wafer 700B and using abrasives to grind substrate 704 to a suitable thickness. Note that according to another process embodiment, the wafer thinning shown in FIG. 7C may be accomplished prior to attaching of the support substrate 708, as shown in FIG. 7B, to the front of the semiconductor wafer 700A.

Figure 7D:
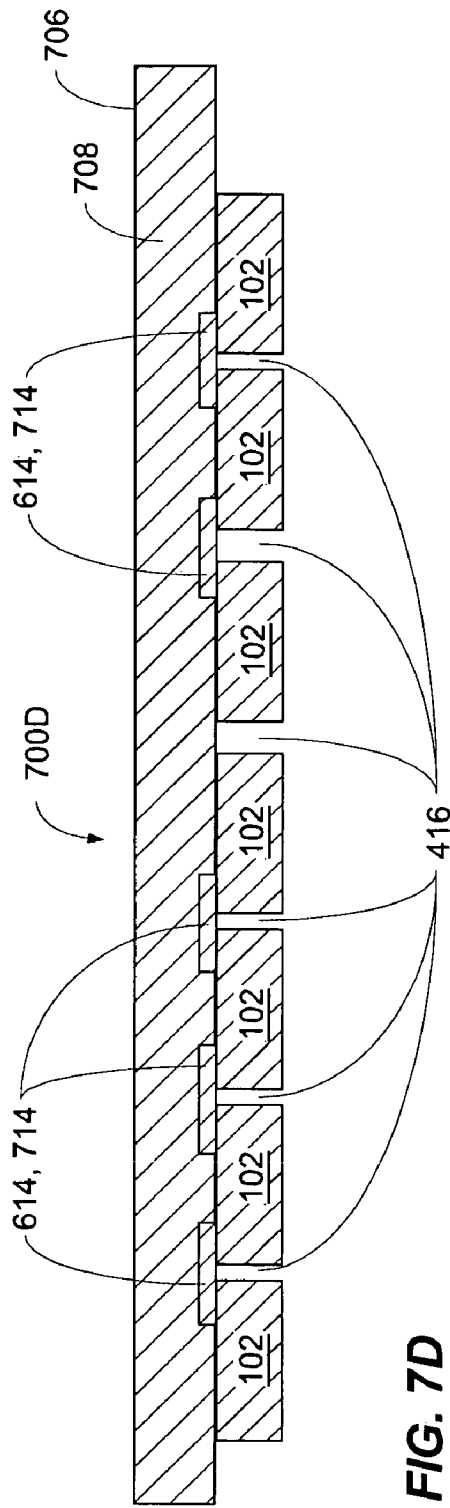

FIG. 7D is a section view of a diced wafer, shown generally by arrow 700D. Diced wafer 700D may be obtained by dicing electronics 102 formed on the thinned wafer 700C by sawing, etching, or any other suitable means for physically separating electronics 102 from one another to introduce gaps 416. It will be apparent that the diced electronics 102 may still be supported on support substrate 708, as disclosed herein and also known to those skilled in the art. Once the diced wafer 700D is formed, it may be back-filled, passivated, or sealed with a conformal coating to fill in the gaps 416 formed by the dicing process illustrated in FIG. 7D. Note that the back-filling is not shown in FIG. 7D.

Figure 7E:
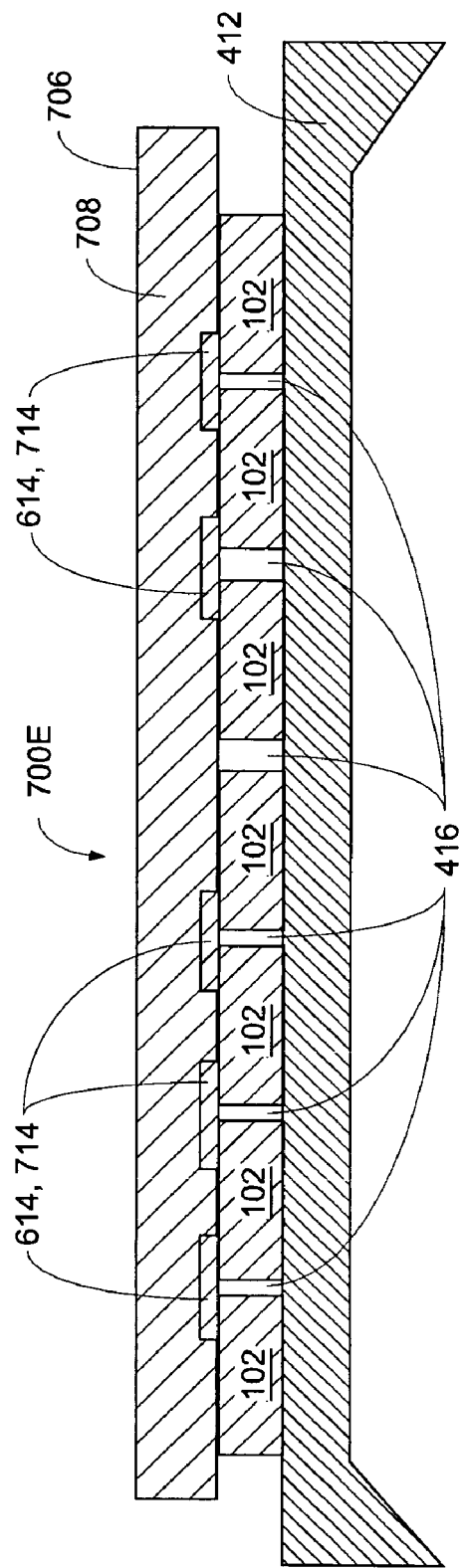

FIG. 7E is a section view of a mounted wafer, shown generally by arrow 700E. Mounted wafer 700E may be obtained by mounting diced wafer 700D onto a chip carrier 412. Note that additional interconnecting (not shown in FIG. 7E) may be performed to electrically connect diced wafer 700D to the chip carrier 412. Any suitable adhesive or adhesive tape (not shown in FIG. 7E) may be used to mount diced wafer 700D onto chip carrier 412. Finally, the mounted wafer may be further back-filled, passivated, or sealed with a conformal coating and packaged as an integrated circuit, as described above.

Figure 8:
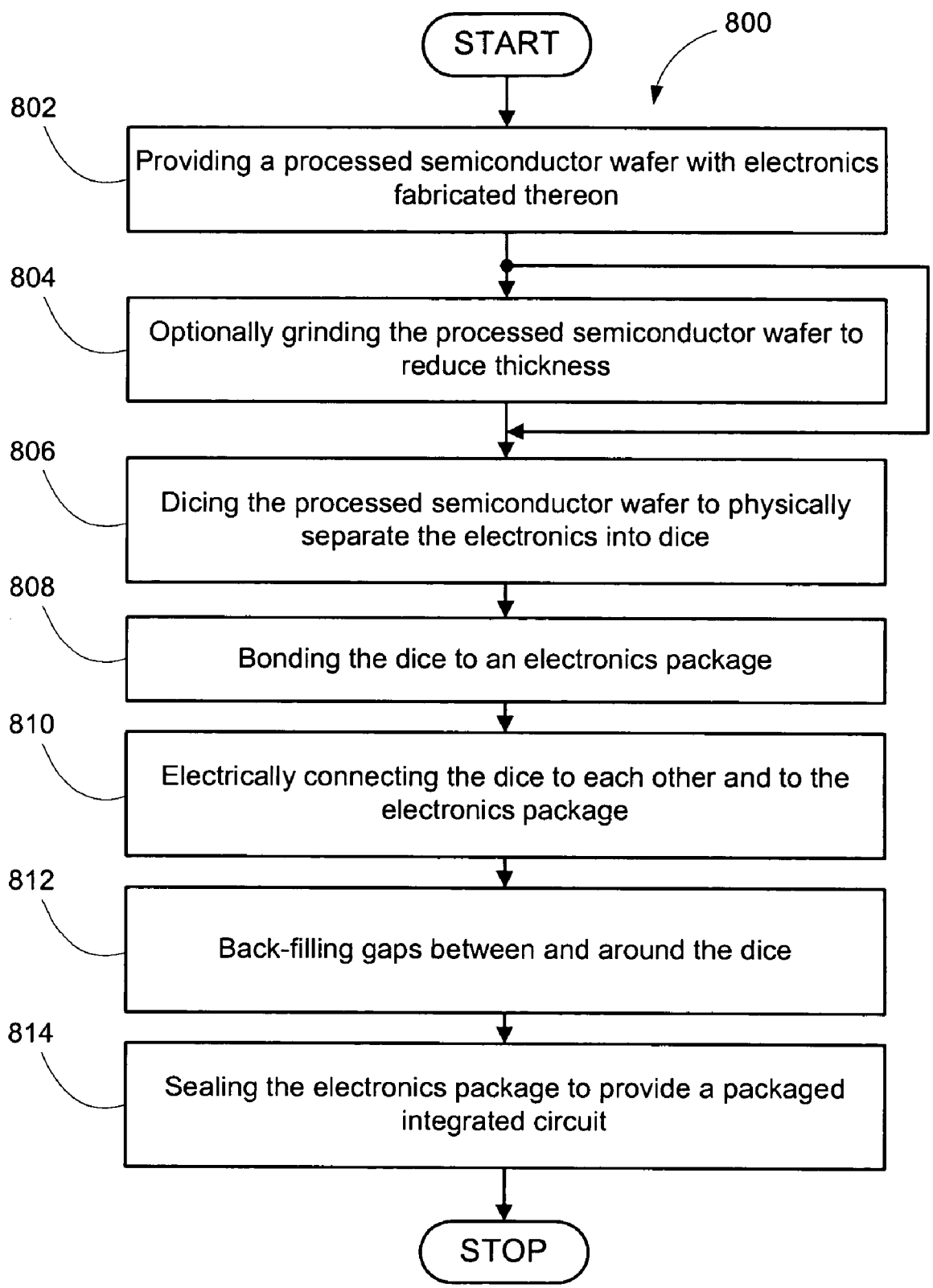
FIG. 8 is a flow chart of an exemplary embodiment of a method of packaging integrated circuits according to the present invention.

FIG. 8 is a flow chart of an exemplary embodiment of a method 800 of packaging ICs according to the present invention. Method 800 may include providing 802 a processed semiconductor wafer with electronics fabricated thereon. As noted above, the semiconductor wafer may be formed of any suitable semiconductor material, for example and not by way of limitation, silicon, germanium, gallium arsenide, gallium nitride, silicon carbide, diamond, other group III/V semiconductor compounds, or any other suitable semiconductor material according to embodiments of the present invention. Electronics may be formed through any suitable electronics fabrication process, including a CMOS process.

Method 800 may further include optionally grinding 804 the processed semiconductor wafer to reduce thickness. Grinding 804 the processed semiconductor wafer may include applying grinding tape to an electronics side of the processed wafer and grinding an opposite side of the processed wafer, see, e.g., grinding tape 956 in FIG. 9B and related discussion below.

Method 800 may further include dicing 806 the processed semiconductor wafer to physically separate the electronics into dice. Dicing 806 may be performed using any known method of dicing. For example and not by way of limitation, dicing 806 the processed semiconductor wafer may include applying dicing tape to a substrate side of the processed semiconductor wafer and diamond-tipped sawing regions between the electronics.

Method 800 may further include bonding 808 the dice to an electronics package. Bonding 808 the dice to an electronics package may include using any one or more of the following: non-conductive epoxy, adhesive, adhesive tape, thermal bonding, eutectic bonding, silicon/SiO2 bonding, anodic bonding, or any other suitable adhesive or means for attaching electronics dice to an electronics package. The electronics package may be of any suitable material and configuration. For example and not by way of limitation, the electronics package may be formed of ceramic material and configured as a frame lid assembly as known to those skilled in the art.

Method 800 may further include electrically connecting 810 the dice to each other and to the electronics package. See, e.g., wire-bonding as illustrated in FIG. 9E and as discussed below and elsewhere herein. Method 800 may further include back-filling 812 gaps between and around the dice and sealing 814 the electronics package to provide a packaged integrated circuit. Back-filling 812 may be achieved by applying Parylene or cyanoacrylate or any other suitable back-filling material. Sealing 814 may comprise completely back-filling the electronics package. Alternatively, once back-filling to coat the electrically connected dice has been achieved, the remaining space or chamber inside the electronics package may be evacuated to increase breakdown voltage or filled with nitrogen to improve thermal dissipation characteristics.

Figure 9A:
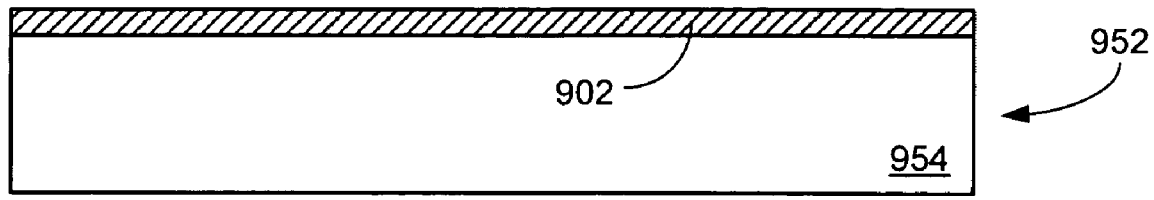
FIGS. 9A-9G are a series of process illustrations corresponding to a particular embodiment of the method of FIG. 8.
Figure 9B:
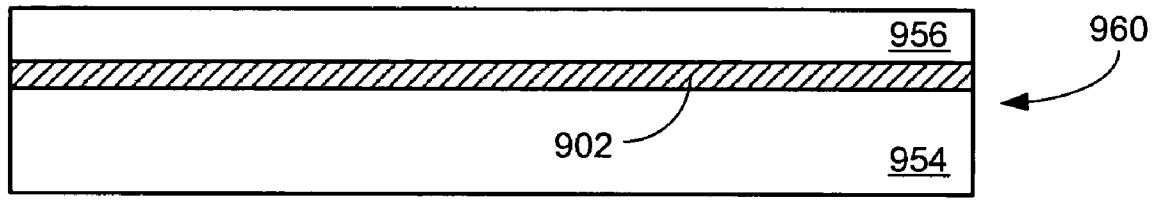
Figure 9C:
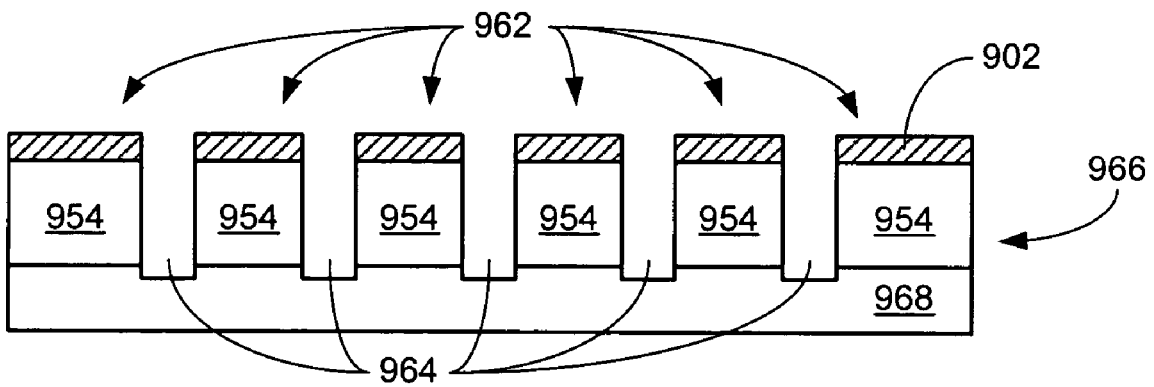
Figure 9D:
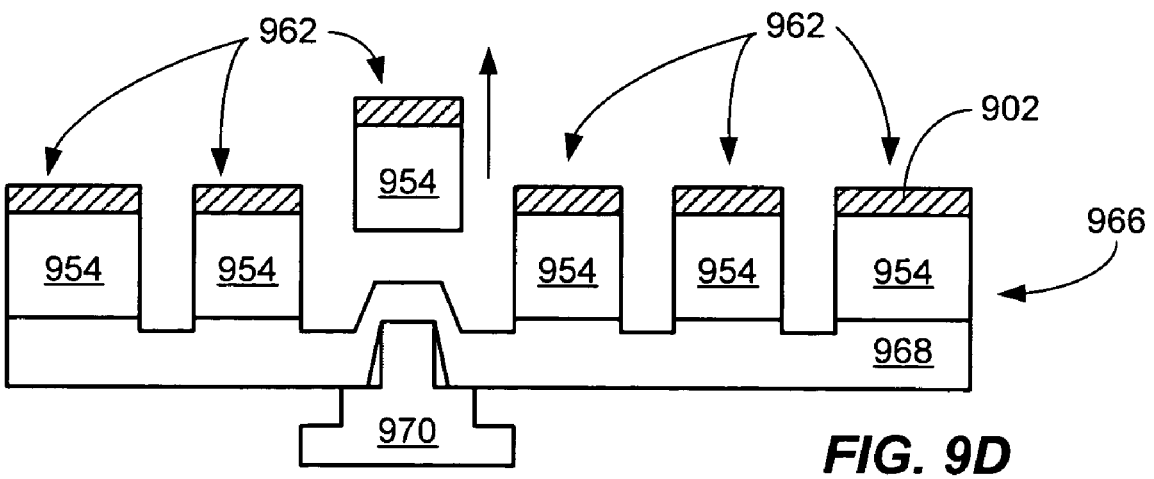
Figure 9E:
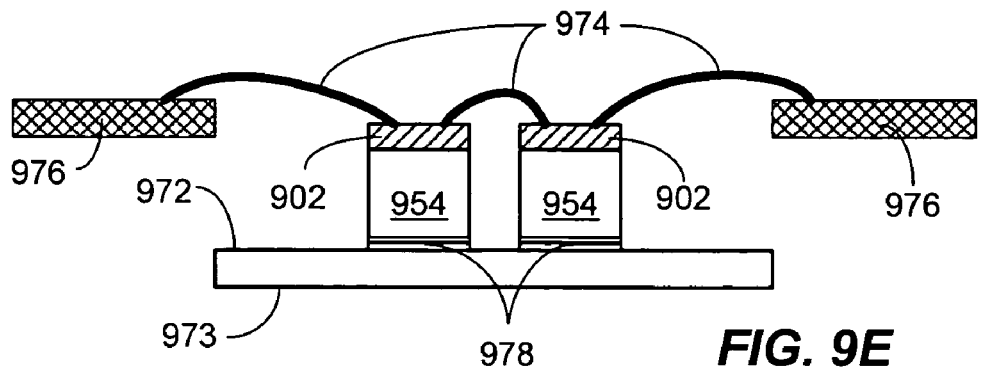

FIGS. 9A-H are a series of process illustrations corresponding to a particular embodiment of method 800 (shown in FIG. 8). More specifically, FIG. 9A illustrates a section view of a processed semiconductor wafer 952. Semiconductor wafer 952 may have a layer of electronics 902 formed on one side of a semiconductor substrate 954.

FIG. 9B illustrates a section view of a processed semiconductor wafer 960 that has been optionally thinned. Optional thinning may be achieved by applying a grinding tape 956 to the electronics 902 side of substrate 954 and thinning the opposite or substrate side 954 according any known method of thinning semiconductor wafers. FIG. 9C illustrates a section view of a processed semiconductor wafer that has been diced. More particularly, FIG. 9C illustrates a diced wafer 966 including six dice 962 that have been formed by creating gaps 964 between the dice 962. According to various embodiments, dicing may be performed by applying dicing tape 968 to the semiconductor substrate 954 and then diamond-tipped sawing or any other suitable dicing means known to those skilled in the art.

FIG. 9D illustrates a section view of a pick and place operation performed on one of the dice prior to placement on a semiconductor package. More particularly, FIG. 9D illustrates a pick and place tool head pushing up (see arrow near loose die 962) through dicing tape 968 to free a die 962 for placement on a semiconductor package.

FIG. 9E illustrates mounting of the dice 962 and electrically connecting the dice 962 to each other and to the semiconductor package. More particularly, FIG. 9E illustrates two dice 962 that have been bonded 978 to a bottom surface 972 of an electronics package (not completely shown in FIG. 9E, but see 980 in FIG. 9G). The bottom surface 972 may be formed with a layer of an insulating material 973. Insulating material 973 may be formed of polyimide or any other suitable insulating material, such as those disclosed herein. Electronics package 980 may be any suitable packaging material and configuration or technology suitable for receiving dice 962. Bonding 978 may be achieved using non-conductive epoxy, adhesive, adhesive tape, thermal bonding, eutectic bonding, silicon/SiO2 bonding, anodic bonding, or any other suitable adhesive or means for attaching electronics dice to an electronic package as describe herein. FIG. 9E also illustrates the use of wire-bonding 974 to electrically connect the dice 962 to each other and to lead frames (shown partially at 976) of the electronic package.

Figure 9F:
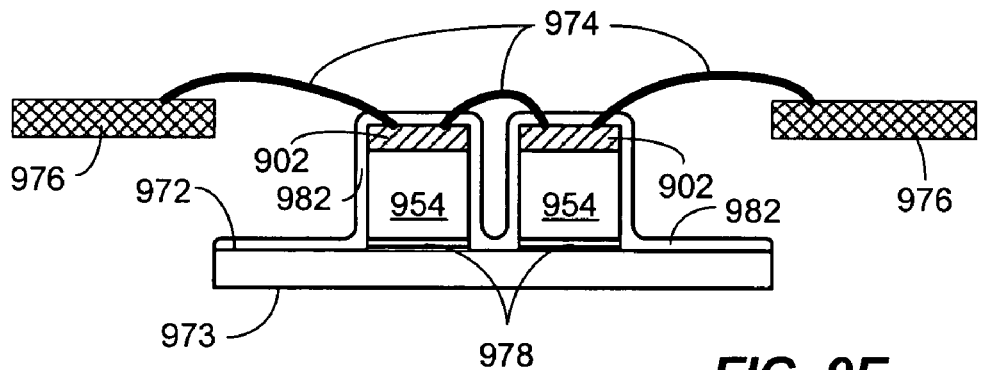

FIG. 9F illustrates back-filling 982 the electrically connected dice 962 of FIG. 9E. More particularly, FIG. 9F illustrates the use of a back-filling material 982 applied to the exposed surfaces of the electrically connected dice 962. This back-filling material further isolates the dice 962 from each other to achieve higher breakdown voltages.

Figure 9G:
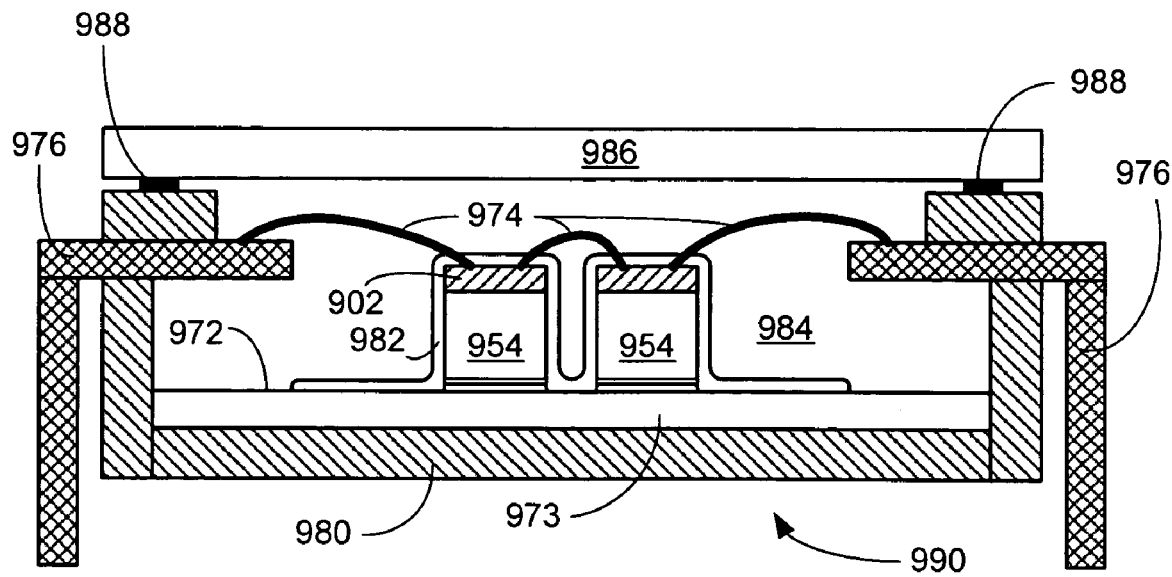

FIG. 9G illustrates a section view of sealing 988 the electronics package 980 to provide a packaged IC, shown generally by arrow 990. More particularly, FIG. 9G illustrates a frame lid assembly (FLA) having a lid 986 having seals 988 that may be activated by heat, current, or other means. Lid 986 may be formed of any suitable material such as, for example and not by way of limitation, "Alloy 42" or Kovar™. Kovar™ is a Westinghouse trademark for an alloy of iron, nickel and cobalt, which has the same thermal expansion as glass and therefore is often used for glass-to-metal or ceramic-to-metal seals.

FIG. 9G also illustrates that the chamber 984 inside the electronics package 980 where the dice 962 are mounted and encapsulated 982 may not be completely filled. Sealing of the electronics package 980 may include the introduction of nitrogen in the chamber 984 prior to sealing 988 of the lid 986, according to one embodiment of the present invention. Nitrogen filled electronic packages 980 have good thermal conducting characteristics. According to another embodiment, the chamber 984 may be evacuated prior to sealing 988 of the lid 986. A vacuum in the chamber 984 provides higher breakdown voltage characteristics.

Figure 10:
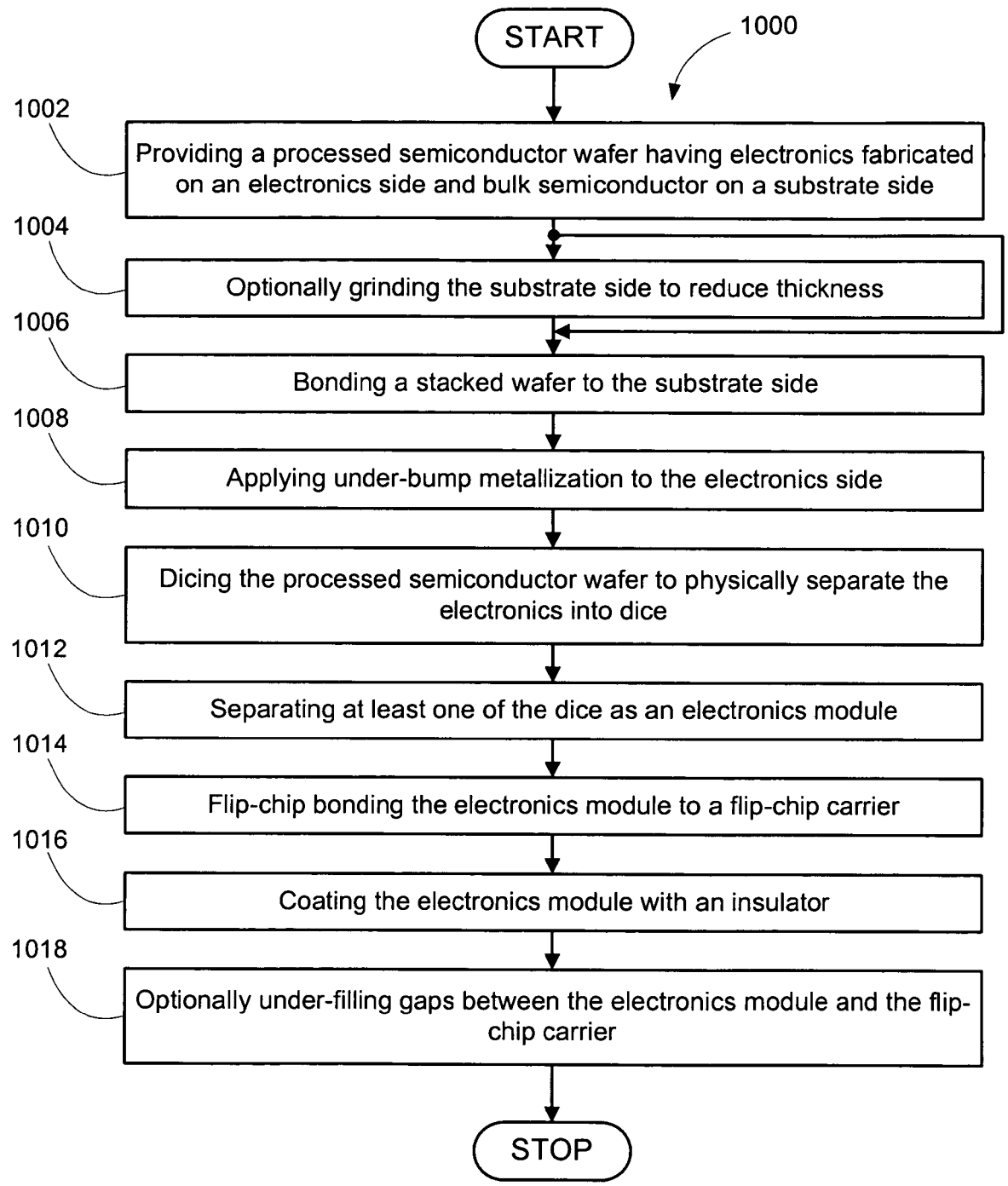
FIG. 10 is a flowchart of an embodiment of a method of flip-chip packaging integrated circuits according to the present invention.

FIG. 10 is a flowchart of an embodiment of a method 1000 of flip-chip packaging integrated circuits according to the present invention. Method 1000 may include providing 1002 a processed semiconductor wafer having electronics fabricated on an electronics side and bulk semiconductor on a substrate side. Method 1000 may further include optionally grinding 1004 the substrate side to reduce thickness. Method 1000 may further include bonding 1006 a stacked wafer to the substrate side. Method 1000 may further include applying 1008 under-bump metallization to the electronics side. Method 1000 may further include dicing 1010 the processed semiconductor wafer to physically separate the electronics into dice. Method 1000 may further include separating 1012 at least one of the dice as an electronics module. Method 1000 may further include flip-chip bonding 1014 the electronics module to a flip-chip carrier. Method 1000 may further include coating 1016 the electronics module with an insulator. Method 1000 may further include optionally under-filling 1018 gaps between the electronics module and the flip-chip carrier.

According to one embodiment bonding 1006 the stacked wafer to the substrate side may include applying a heat sealable polyimide tape between the stacked wafer and the substrate side. However, any suitable means for bonding the stacked wafer may be employed consistent with the principles of the present invention. According to yet another embodiment, the stacked wafer may be formed of Corning™ code 7740 borosilicate glass. However, it will be apparent that other forms and materials of stacked wafers may be employed, consistent with the purpose of providing a non-conductive insulating substrate for use as a stacked wafer in flip-chip bonding of the processed semiconductor wafer.

According to another embodiment, the flip-chip carrier may be a printed circuit board. According to other embodiments, the flip-chip carrier may be any suitable IC package using flip-chip technology as known to those skilled in the art. Furthermore, coating the electronics module with an insulator may include coating the electronics module with Parylene, cyanoacrylate, or any other suitable insulating coating as disclosed herein.

While the foregoing advantages of the present invention are manifested in the illustrated embodiments of the invention, a variety of changes can be made to the configuration, design and construction of the invention to achieve those advantages. Hence, reference herein to specific details of the structure and function of the present invention is by way of example only and not by way of limitation.

What is claimed is:

1. A process for integrating electronics, comprising:
providing a semiconductor comprising electronics;
providing at least one insulator selected from the group consisting of: plastic, silicon dioxide, diamond, ceramic, glass, silicon, quartz and sapphire;
bonding the semiconductor to the at least one insulator;
trenching the electronics to physically separate them from each other with trench width ranging from about 10 μm to about 50 mm;
dicing the trenched electronics to form at least one insulated module, wherein the at least one insulated module comprises at least one undiced trench;
attaching the at least one insulated module to a chip carrier; and
electrically connecting the electronics to one another across the at least one undiced trench on the at least one insulated module and to the chip carrier to obtain a distributed integrated circuit having a breakdown voltage exceeding 500 V, wherein a dielectric strength of the at least one undiced trench is adapted to establish the breakdown voltage of the distributed integrated circuit.

2. The process according to claim 1, further comprising back-filling the trenched electronics.

3. The process according to claim 2, wherein back-filling comprises depositing the high dielectric breakdown materials using at least one of: screen printing, ink jetting, micromachining, microelectromechanical systems (MEMS) technology, chemical vapor deposition (CVD) and physical vapor deposition (PVD).

4. The process according to claim 2, wherein back-filling comprises applying Parylene or cyanoacrylate.

5. The process according to claim 1, further comprising conformal coating the integrated circuit.

6. The process according to claim 5, wherein the conformal coating comprises applying Parylene.

7. The process according to claim 1, wherein providing a semiconductor comprises providing at least one of: a silicon substrate, a germanium substrate, a gallium arsenide substrate, a gallium nitride substrate, a group III/V compound substrate and a silicon carbide substrate.

8. The process according to claim 1, wherein bonding the semiconductor substrate to the insulator comprises using an adhesive or adhesive tape.

9. The process according to claim 1, wherein bonding the semiconductor substrate to the insulator comprises forming a silicon dioxide layer on a silicon substrate.

10. The process according to claim 1, wherein trenching comprises at least one of: wet etching, dry etching and deep reactive ion etching (DRIE).

11. The process according to claim 1, wherein dicing comprises sawing with a diamond-tipped saw.

12. The process according to claim 1, wherein attaching the at least one insulated module to the chip carrier comprises bonding the at least one insulated module to a chip carrier substrate using at least one of: an adhesive, thermal bonding, eutectic bonding, silicon/$SiO_2$ bonding and anodic bonding.

13. The process according to claim 1, wherein attaching the at least one insulated module to the chip carrier comprises attaching the at least one insulated module to a flip-chip assembly.

14. The process according to claim 1, wherein electrically connecting the electronics to one another on the at least one insulated module and to the chip carrier comprises wire-bonding.

15. The process according to claim 1, further comprising forming a polysilicon resistor adjacent a drift region of a transistor in said electronics.

16. The process according to claim 1, wherein said electrically connecting the electronics to one another across the at least one undiced trench comprises wirebonding electronics across the at least one undiced trench in each said at least one insulated module.

17. The process according to claim 1, wherein one of said at least one insulated module comprises a plurality of regions of said electronics, wherein said regions are physically separated by said trenching, and wherein said regions are not separated by said dicing.

18. The process according to claim 1, further comprising filling said chip carrier with nitrogen.

19. The process according to claim 1, further comprising evacuating a chamber inside said chip carrier.

* * * * *